United States Patent
Chun et al.

(10) Patent No.: US 12,142,317 B2
(45) Date of Patent: Nov. 12, 2024

(54) STORAGE DEVICE INCLUDING AUXILIARY POWER SUPPLY AND METHOD OF OPERATING THE SAME

(71) Applicant: Samsung Electronics Co., Ltd., Suwon-si (KR)

(72) Inventors: Hojin Chun, Seoul (KR); Minsung Kil, Hwaseong-si (KR); Hyoungtaek Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 168 days.

(21) Appl. No.: 17/876,077

(22) Filed: Jul. 28, 2022

(65) Prior Publication Data
US 2023/0186988 A1   Jun. 15, 2023

(30) Foreign Application Priority Data
Dec. 14, 2021   (KR) ................. 10-2021-0178878

(51) Int. Cl.
*G11C 5/14*   (2006.01)
*G11C 14/00*   (2006.01)

(52) U.S. Cl.
CPC .......... *G11C 14/0018* (2013.01); *G11C 5/141* (2013.01)

(58) Field of Classification Search
CPC ..... G11C 14/0018; G11C 5/141; G11C 14/00; G11C 5/143; G06F 1/30; G06F 1/3275
See application file for complete search history.

(56) References Cited

U.S. PATENT DOCUMENTS

| 7,269,755 B2* | 9/2007 | Moshayedi | G06F 11/1441 |
| | | | 714/E11.138 |
| 8,139,392 B2* | 3/2012 | Hosoi | H10B 63/20 |
| | | | 365/100 |

(Continued)

FOREIGN PATENT DOCUMENTS

| KR | 101878200 B1 | 7/2018 |
| KR | 10-2021-0006121 A | 1/2021 |

(Continued)

OTHER PUBLICATIONS

Extended European Search Report dated Jun. 30, 2023 for corresponding European Application No. 22199711.7.

(Continued)

*Primary Examiner* — Khamdan N. Alrobaie
(74) *Attorney, Agent, or Firm* — Harness, Dickey & Pierce, P.L.C.

(57) ABSTRACT

A storage device includes a main system; a power loss protection integrated circuit (PLP IC) configured to provide output power to the main system based on external or internal power; and an auxiliary power supply configured to provide the internal power to the PLP IC. The main system may operate in a dump mode where data is backed up in response to at least one of a first condition or a second condition being satisfied. The PLP IC may provide the output power based on the internal power in response to a sudden power off (SPO) occurring. The first condition is satisfied when the SPO occurs and an SPO time is longer than a maximum filtering time. The second condition is satisfied when the SPO occurs and a voltage level of the internal power provided by the auxiliary power supply is lower than a voltage level of a threshold voltage.

19 Claims, 13 Drawing Sheets

(56) References Cited

U.S. PATENT DOCUMENTS

| | | | |
|---|---|---|---|
| 9,355,025 | B2 | 5/2016 | Shim et al. |
| 9,484,069 | B2 * | 11/2016 | Shim ................ G11C 5/141 |
| 9,754,634 | B2 * | 9/2017 | Shen ................ G11C 5/141 |
| 10,705,155 | B2 | 7/2020 | An et al. |
| 10,782,762 | B2 | 9/2020 | Ryu |
| 11,488,640 | B2 * | 11/2022 | Ryu ................ G11C 16/30 |
| 11,869,602 | B2 * | 1/2024 | Ryu ................ G11C 5/147 |
| 2013/0179629 | A1 * | 7/2013 | Shim ................ G06F 11/073 |
| | | | 711/103 |
| 2017/0271975 | A1 | 9/2017 | Plojhar |
| 2021/0011537 | A1 | 1/2021 | Jeon et al. |
| 2021/0011809 | A1 | 1/2021 | Horspool et al. |
| 2021/0012842 | A1 | 1/2021 | Ryu et al. |
| 2021/0074332 | A1 | 3/2021 | Lee et al. |

FOREIGN PATENT DOCUMENTS

| | | |
|---|---|---|
| KR | 102211867 B1 | 2/2021 |
| KR | 102406667 B1 | 6/2022 |

OTHER PUBLICATIONS

Keni Qiu et al., "Efficient energy management by exploiting retention state for self-powered nonvolatile processors", Journal of Systems Architecture, vol. 87, pp. 23-35, Apr. 11, 2018.

Zejun Shi et al., "Leveraging Energy Cycle Regularity to Predict Adaptive Mode for Non-volatile Processors", IEEE 30th International Conference on Application-Specific System, Architectures and Processors (ASAP), 2019, pp. 189-196.

Yan Wang et al., "Performance-oriented cache management scheme based on a retention state for energy-harvesting nonvolatile processors", Future Generation Computer Systems, vol. 129, pp. 90-98, 2022.

Dongqin Zhou et al., "A Dual-Threshold Scheme Along with Security Reinforcement for Energy Efficient Nonvolatile Processors", IEEE Computer Society Annual Symposium on VLSI, 2018, pp. 70-75.

* cited by examiner

STORAGE DEVICE INCLUDING AUXILIARY POWER SUPPLY AND METHOD OF OPERATING THE SAME

CROSS-REFERENCE TO RELATED APPLICATION

This application claims priority under 35 U.S.C. § 119 to Korean Patent Application No. 10-2021-0178878, filed on Dec. 14, 2021 in the Korean Intellectual Property Office, the disclosure of which is incorporated by reference herein in its entirety.

BACKGROUND

The inventive concepts relate to storage devices, and more particularly, to storage devices including an auxiliary power supply supplying power thereto and methods of operating the same.

In general, a memory system including memory devices and a memory controller receives power from the outside to operate. Meanwhile, a sudden power off (SPO) situation in which power is suddenly blocked while the memory system operates may occur. At this time, because the memory controller stores data by using volatile memory, the data stored in the volatile memory may be lost or an operation (for example, an erase operation or a write operation) that is being performed by the memory device may not be completed.

SUMMARY

The inventive concepts relate to storage devices operating in a dump mode based on at least one of a voltage level of external power or a voltage level of internal power.

Objects of the inventive concepts are not limited thereto and other objects that are not described may be clearly understood by those skilled in the art from the following description.

According to some example embodiments of the inventive concepts, a storage device may include a main system; a power loss protection integrated circuit (PLP IC) configured to provide output power to the main system based on external power or internal power; and an auxiliary power supply configured to provide the internal power to the PLP IC. The main system may be configured to operate based on the output power and to operate in a dump mode in which data is backed up in response a determination that at least one of a first condition or a second condition is satisfied. The PLP IC may be configured to provide the output power to the main system based on the internal power in response to a sudden power off (SPO) occurring. The first condition may be determined to be satisfied in response to a determination that the SPO occurs so that the output power is provided to the main system based on the internal power, and an SPO time is longer than a maximum filtering time. The second condition may be determined to be satisfied in response to a determination that the SPO occurs so that the output power is provided to the main system based on the internal power, and a voltage level of the internal power provided by the auxiliary power supply is lower than a voltage level of a threshold voltage.

According to some example embodiments of the inventive concepts, a method of operating a storage device that includes an auxiliary power supply may include determining whether a sudden power off (SPO) occurs based on monitoring a voltage level of external power, operating in an internal power supply mode in which internal power is supplied based on electrical energy stored in the auxiliary power supply in response to a determination that the SPO occurs, and operating in a dump mode in which data is backed up based on a determination that at least one of a first condition or a second condition is satisfied. The first condition may be determined to be satisfied in response to a determination that an SPO time is longer than a maximum filtering time, and the second condition may be determined to be satisfied in response to a determination that a voltage level of the internal power is lower than a voltage level of a threshold voltage.

According to some example embodiments of the inventive concepts a method of operating a storage device including a main system and an auxiliary power supply may include generating an external power signal based on monitoring a voltage level of external power based on using a power loss protection integrated circuit (PLP IC), generating a power mode signal controlling the PLP IC to supply internal power based on electrical energy stored in the auxiliary power supply to the main system in response to the external power signal in response to a determination by the main system that a sudden power off (SPO) occurs, continuously performing an operation that is being performed by the main system immediately after the SPO occurs based on the internal power, and causing the main system to back up data from a time at which an SPO time is equal to a maximum filtering time in response to a determination that the SPO time is longer than the maximum filtering time.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
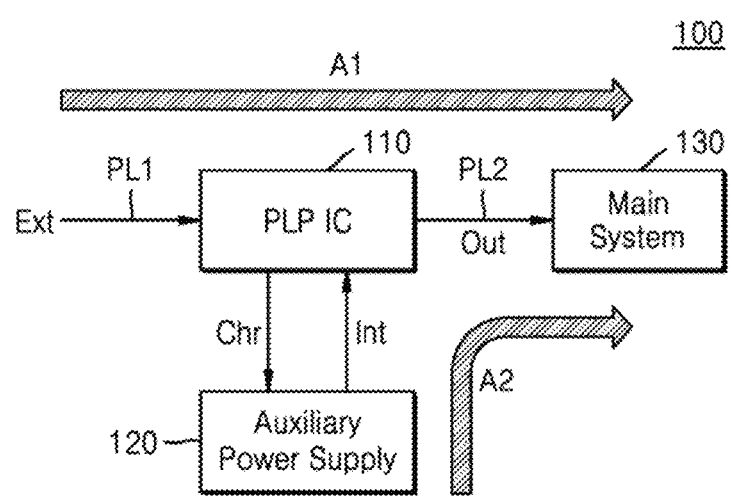
FIG. 1 is a block diagram illustrating a storage device according to some example embodiments of the inventive concepts.

Hereinafter, some example embodiments of the inventive concepts will be described in detail with reference to the accompanying drawings.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

FIG. 1 is a block diagram illustrating a storage device 100 according to some example embodiments of the inventive concepts.

Referring to FIG. 1, the storage device 100 may include a solid state drive (SSD). When the storage device 100 includes an SSD, the storage device 100 may correspond to a flash memory device including at least one flash memory chip (for example, a NAND memory chip) storing data.

The storage device 100 may be an embedded multimedia card (eMMC) or an embedded universal flash storage (UFS) memory device. For example, the storage device 100 may be a UFS memory card, a compact flash (CF) card, a secure digital (SD) card, a micro-SD card, a mini-SD card, an extreme digital (xD) card, or a memory stick. However, the storage device 100 according to the inventive concepts is not limited to a memory system.

The storage device 100 may include a power loss protection integrated circuit (PLP IC) 110, an auxiliary power supply 120, and a main system 130. The PLP IC 110 may provide output power Out to the main system 130, and the main system 130 may perform an operation by using the output power Out received from the PLP IC 110.

The PLP IC 110 may monitor a voltage level of external power Ext supplied through a first power line PL1. The PLP IC 110 may operate in an external power operation mode or an internal power operation mode based on the voltage level of the external power Ext.

For example, when the external power Ext supplied through the first power line PL1 is normally supplied to the PLP IC 110, the PLP IC 110 may allow the external power Ext to be output to a second power line PL2 as main power and may prevent electrical energy (that is, internal power Int) charged in the auxiliary power supply 120 from being output to the second power line PL2 as auxiliary power. That is, as marked with a first arrow A1, the external power Ext may be supplied to the main system 130 through the PLP IC 110. In other words, the output power Out may be the external power Ext. As marked with the first arrow A1, when the external power Ext is supplied to the main system 130 through the PLP IC 110, it may be referred that the PLP IC 110 'operates in an external power supply mode'.

Hereinafter, when the external power Ext is normally supplied to the PLP IC 110, the voltage level of the external power Ext may be, for example, no less than an initially set minimum operation allowable voltage level. As used herein, the term "voltage level" of power may be referred to interchangeably as "magnitude of voltage" of the power. In addition, when the external power Ext is not normally supplied to the PLP IC 110, the voltage level of the external power Ext may be less than the initially set minimum operation allowable voltage level. For example, in a sudden power off (SPO) situation in which power is suddenly blocked (e.g., external power Ext is inhibited) while the storage device 100 operates, the external power Ext may not be normally supplied to the PLP IC 110. For example, the PLP IC 110 may be configured to provide the output power Out to the main system 130 based on the internal power Int in response to the SPO occurring (e.g., in response to a determination that the PLP IC 110 that the SPO has occurred).

On the other hand, when the external power Ext supplied through the first power line PL1 is not normally supplied to the PLP IC 110, the PLP IC 110 may prevent the external power Ext from being output to the second power line PL2 as the main power and may allow the internal power Int charged in the auxiliary power supply 120 to be output to the second power line PL2 as the auxiliary power. That is, as marked with a second arrow A2, the internal power Int received from the auxiliary power supply 120 may be supplied to the main system 130 through the PLP IC 110. The output power Out may be the internal power Int converted to have a constant voltage level in the PLP IC 110. As marked with the second arrow A2, when the internal power Int is supplied to the main system 130 through the PLP IC 110, it may be referred that the PLP IC 110 'operates in an internal power supply mode'. For example, when the SPO situation occurs (e.g., is determined to occur, for example by the PLP IC 110), the PLP IC 110 may supply the internal power Int charged in the auxiliary power supply 120 to the main system 130 as the auxiliary power.

When the PLP IC 110 operates in the external power supply mode, the PLP IC 110 may repeatedly charge the electrical energy in the auxiliary power supply 120 by using the external power Ext supplied through the first power line PL1. That is, the PLP IC 110 may provide charging power Chr for charging the auxiliary power supply 120 to the auxiliary power supply 120 by using the external power Ext.

The auxiliary power supply 120 may include one or more capacitors. The auxiliary power supply 120 may store the electrical energy by using the charging power Chr. In addition, the auxiliary power supply 120 may complete an operation that is being performed by the main system 130 and may back up data by supplying the electrical energy stored in the auxiliary power supply 120 to the main system 130 as the internal power Int in the SPO situation. Hereinafter, when the main system 130 continuously performs the operation that is being performed by using the internal power Int, it may be referred that 'the main system 130 operates in a filtering mode'. In addition, when the main system 130 backs up the data by using the internal power Int, it may be referred that 'the main system 130 operates in a dump mode'.

The main system 130 may operate by using the output power Out supplied through the second power line PL2. For example, when the external power Ext is normally supplied to the first power line PL1, as the PLP IC 110 operates in the external power supply mode, the external power Ext may be supplied to the main system 130 as the output power Out and the main system 130 may receive the external power Ext through the second power line PL2.

On the other hand, when the external power Ext is not normally supplied to the first power line PL1, the PLP IC 110 may operate in the internal power supply mode. Therefore, the PLP IC 110 may provide the internal power Int converted to have the constant voltage level therein to the main system 130 as the output power Out. When the PLP IC 110 operates in an internal power supply mode, the main system 130 may operate in the filtering mode or dump mode. The main system 130 may operate in the dump mode based on at least one of the voltage level of the external power Ext or a voltage level of the internal power Int. An operation mode of the main system 130 will be described in detail with reference to FIGS. 6 to 9.

The main system 130 may monitor the voltage level of the output power Out and the voltage level of the internal power Int. For example, the main system 130 may monitor a change in capacitance of the auxiliary power supply 120 by measuring the voltage level (e.g., magnitude of voltage) of the internal power Int. The main system 130 may generate an operation signal based on a monitoring result.

The main system 130 may include hardware or software for controlling the PLP IC 110. The main system 130 may receive the result of monitoring the voltage level of the external power Ext from the PLP IC 110 and may control the PLP IC 110 to operate in the external power supply mode or the internal power supply mode based on the result of monitoring the voltage level of the external power Ext.

When the PLP IC 110 operates in an internal power supply mode, the main system 130 may require a significant amount of the electrical energy charged in the auxiliary power supply 120 in order to operate in the dump mode in which data is backed up. As the capacitance of the auxiliary power supply 120 is reduced with time, the electrical energy charged in the auxiliary power supply 120 may also be reduced. When the electrical energy charged in the auxiliary power supply 120 is less than the electrical energy required for the main system 130 to operate in the dump mode, the storage device 100 may be turned off before the main system 130 backs up all the data.

According to some example embodiments of the inventive concepts, the main system 130 operates in the dump mode based on at least one of the voltage level of the external power Ext or the voltage level of the internal power Int so that the main system 130 may operate in the filtering mode without backing up the data in the short SPO situation caused by noise. More specifically, the main system 130 may operate in the dump mode based on at least one of an SPO time or the voltage level of the internal power Int. For example, the main system 130 may be configured to operate based on the output power Out and to operate in a dump mode in which data is backed up in response a determination (e.g., by the main system 130) that at least one of a first condition or a second condition is satisfied, wherein the first condition is determined (e.g., by the main system 130) to be satisfied in response to a determination (e.g., by the main system 130) that the SPO occurs so that the output power Out is provided (e.g., by the PLP IC 110) to the main system 130 based on the internal power Int, and an SPO time (e.g., duration of the SPO) is longer than a maximum filtering time, and wherein the second condition is determined (e.g., by the main system 130) to be satisfied in response to a determination (e.g., by the main system 130) that the SPO occurs so that the output power is provided to the main system 130 (e.g., by the PLP IC 110) based on the internal power Int, and a voltage level of the internal power Int provided by the auxiliary power supply 120 is lower than a voltage level of a threshold voltage. As both the first and second conditions include the occurrence of the SPO, the main system 130 may be configured to, in response to an SPO occurring, only operate in a dump mode in which data is backed up in response a determination that at least one of the first condition or the second condition is satisfied, for example refraining from operating in the dump mode and/or from backing up data unless at least one of the first condition or the second condition is satisfied. For example, the main system 130 may be prevented from unnecessarily operating in the dump mode during an SPO time (e.g., unless the SPO time, or duration, exceeds a maximum filtering time or a voltage level of the internal power Int provided by the auxiliary power supply 120 is lower than a voltage level of a threshold voltage).

By preventing the main system 130 from unnecessarily operating in the dump mode, it is possible to save the electrical energy consumed by the main system 130 operating in the dump mode and to prevent the storage device 100 from being turned off while the main system 130 operates in the dump mode. Therefore, it is possible to reduce a recognition defect of the storage device 100 and to increase reliability of the storage device 100. Furthermore, a storage device including a main system 130, PLP IC 110, and auxiliary power supply 120 configured as described above may be further configured to reduce unnecessary depletion of internal power Int provided by the auxiliary power supply 120 during the SPO, thereby reducing unnecessary power consumption by the storage device 100, improving power consumption efficiency, reducing the risk of depletion of the internal power Int during an SPO which might lead to a recognition defect of the storage device, improving reliability of the storage device 100, and thereby improving the functionality and performance of the storage device 100.

Hereinafter, referring to FIGS. 2 to 4, configurations of the PLP IC 110, the auxiliary power supply 120, and the main system 130 will be described later.

Figure 2:
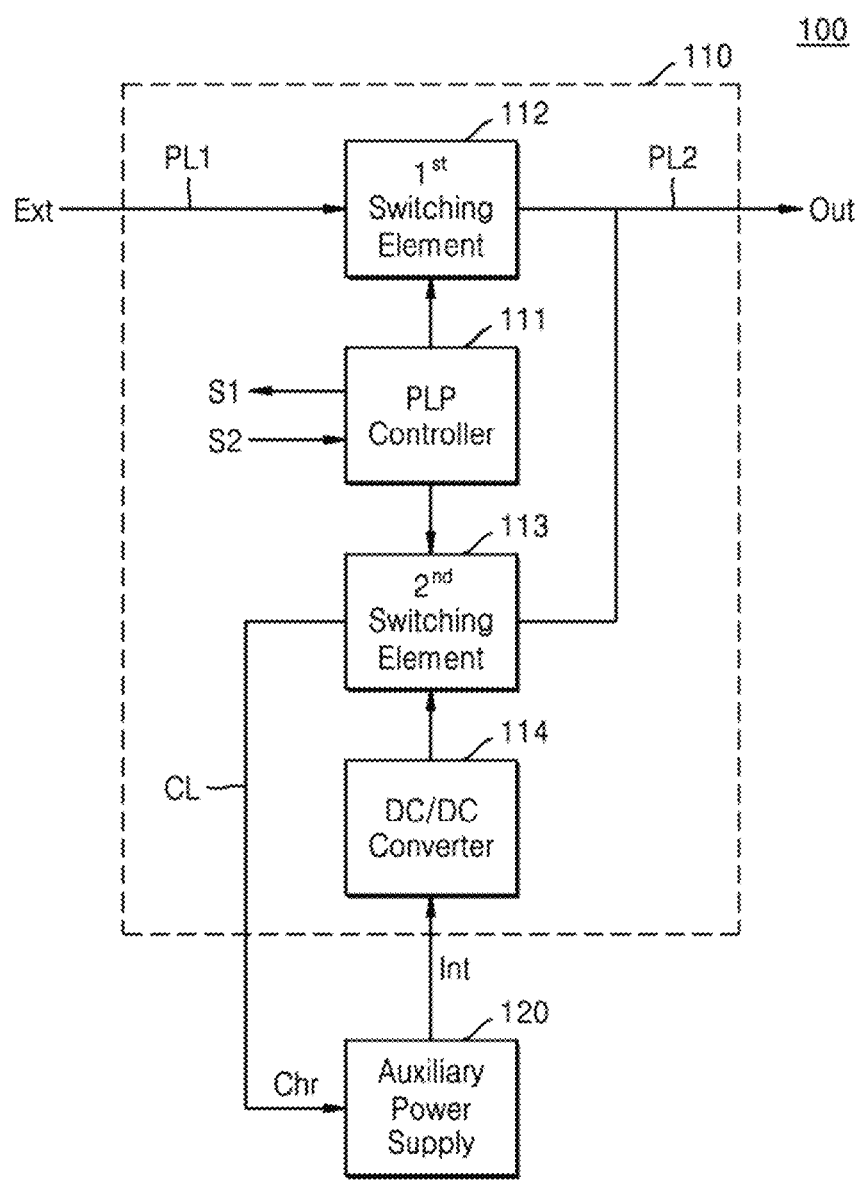
FIG. 2 is a block diagram illustrating a structure of a power loss protection integrated circuit (PLP IC) according to some example embodiments of the inventive concepts.

FIG. 2 is a block diagram illustrating a structure of a PLP IC 110 according to some example embodiments of the inventive concepts. Specifically, FIG. 2 illustrates a structure of the PLP IC 110 of the storage device 100 of FIG. 1. Hereinafter, description will be given with reference to FIG. 1 and previously given description will not be given again.

Referring to FIG. 2, the PLP IC 110 may be implemented by a chip. The PLP IC 110 may include a PLP controller 111, a first switching element 112, a second switching element 113, and a direct current (DC)/DC converter 114.

The PLP controller 111 may monitor a change in voltage level of the external power Ext. The PLP controller 111 may generate an external power signal S1 based on the voltage level of the external power Ext. For example, the PLP controller 111 may generate the external power signal S1 at a first level when the external power Ext is normally provided and may generate the external power signal S1 at a second level when the external power Ext is abnormally provided. Hereinafter, a case in which the external power Ext is abnormally provided may mean the SPO situation. The first level may be one of a high level or a low level. For example, the first level may be the high level and the second level may be the low level. However, the inventive concepts is not limited thereto. In some example embodiments, the PLP controller 111 may be a micro-controller unit (MCU).

The PLP controller 111 may transmit the external power signal S1 to the main system 130 (refer to FIG. 1), and the main system 130 (refer to FIG. 1) may generate a power mode signal S2 in response to the external power signal S1. The main system 130 (refer to FIG. 1) may transmit the power mode signal S2 to the PLP controller 111. The PLP controller 111 may control the first switching element 112 and the second switching element 113 so that the PLP IC 110 operates in the external power operation mode or the internal power operation mode based on the power mode signal S2. That is, the PLP controller 111 may operate in the external power operation mode or the internal power operation mode based on the voltage level of the external power Ext.

The first switching element 112 may transmit an external power Ext supplied through the first power line PL1 to the main system 130 through the second power line PL2. When the external power Ext is normally supplied to the PLP IC 110, because the PLP IC 110 operates in the external power supply mode in response to the power mode signal S2, the first switching element 112 may be turned on so that the external power Ext is output to the second power line PL2 as the output power Out. When the external power Ext is not normally supplied to the auxiliary power supply 120, because the PLP IC 110 operates in the internal power supply mode in response to the power mode signal S2, the first switching element 112 may be turned off so that the external power Ext is not output to the second power line PL2. Therefore, it is possible to prevent the external power Ext from being output to the second power line PL2.

The second switching element 113 may transmit the internal power Int output from the DC/DC converter 114 to the main system 130 through the second power line PL2. When the external power Ext is normally supplied to the PLP IC 110, because the PLP IC 110 operates in the external power supply mode in response to the power mode signal S2, the second switching element 113 may be turned off so that the internal power Int output from the DC/DC converter 114 is not output to the second power line PL2. Therefore, it is possible to prevent the internal power Int output from the DC/DC converter 114 from being output to the second power line PL2. When the external power Ext is not normally supplied to the auxiliary power supply 120, because the PLP IC 110 operates in the internal power supply mode in response to the power mode signal S2, the second switching element 113 may be turned on so that the output power Out based on the internal power Int is output to the second power line PL2.

The DC/DC converter 114 may be connected between the second switching element 113 and the auxiliary power supply 120. The DC/DC converter 114 may convert the voltage level of the internal power Int supplied by the auxiliary power supply 120. For example, the DC/DC converter 114 may output, to the second switching element 113, the internal power Int of which voltage is converted into a voltage suitable to be used by the main system 130 (refer to FIG. 1). For example, the DC/DC converter 114 may convert the internal power Int to have a constant voltage level and may provide the converted internal power Int to the second switching element 113. In some example embodiments, the DC/DC converter 114 may be a buck converter.

The second switching element 113 may be connected between the second power line PL2 and a charging line CL. The charging line CL may connect the second switching element 113 to the auxiliary power supply 120. When the external power Ext is normally supplied to the PLP IC 110 so that the PLP IC 110 operates in the external power supply mode, the second switching element 113 may provide the output power Out (that is, the external power Ext) output through the second power line PL2 to the auxiliary power supply 120 as the charging power Chr. On the other hand, when the external power Ext is not normally supplied to the PLP IC 110 so that the PLP IC 110 operates in the internal power supply mode, the second switching element 113 may not provide the output power Out (that is, the internal power Int) output through the second power line PL2 to the auxiliary power supply 120 as the charging power Chr. That is, the second switching element 113 may allow the auxiliary power supply 120 to perform a charging operation only when the PLP IC 110 operates in the external power supply mode.

Figure 3:
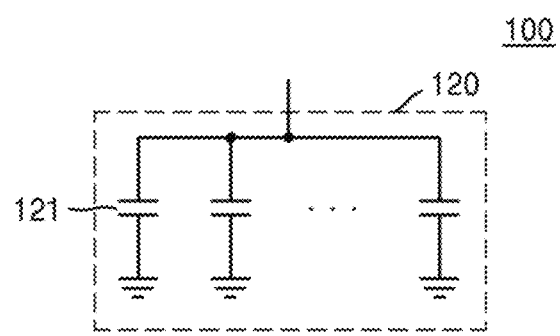
FIG. 3 is a circuit diagram illustrating an auxiliary power supply according to some example embodiments of the inventive concepts.

FIG. 3 is a circuit diagram illustrating an auxiliary power supply 120 according to some example embodiments of the inventive concepts. Specifically, FIG. 3 is a circuit diagram illustrating the auxiliary power supply 120 included in the storage device 100 of FIG. 1. Hereinafter, description will be given with reference to FIG. 1 and previously given description will not be given again.

The auxiliary power supply 120 may include one or more capacitors 121. For example, the auxiliary power supply 120 may have a structure in which at least two capacitors 121 are connected to each other in parallel. Each of the capacitors 121 may be distinguished into an electrolytic capacitor, a tantalum (Ta) capacitor, a film capacitor, or a ceramic capacitor in accordance with a dielectric material.

In the electrolytic capacitor, a thin oxide film may be used as a dielectric material and aluminum (Al) may be used as an electrode. The electrolytic capacitor may have high low frequency characteristics and may be implemented to have high capacity up to tens of thousands µF. The Ta capacitor may include Ta and may have temperature and frequency characteristics higher than those of the electrolytic capacitor. The film capacitor may have a structure in which a film dielectric, such as polypropylene, polystyrol, or Teflon, is placed between electrodes, such as Al and copper (Cu), and the electrodes are rolled up. The film capacitor may have capacity and a purpose that vary in accordance with a material and manufacturing processes. In the ceramic capacitor, a high dielectric constant material, such as titanium (Ti)-barium (Ba), may be used as a dielectric material. The ceramic capacitor may have high frequency characteristics and may be used for passing noise to ground. In a multilayer ceramic condenser (MLCC) that is a kind of the ceramic capacitor, multilayer high dielectric constant ceramic may be used as a dielectric material between electrodes. Because the MLCC has high temperature and frequency characteristics and is small, the MLCC may be used for bypass.

Each of the capacitors 121 constituting the auxiliary power supply 120 according to some example embodiments may include an Al capacitor, the Ta capacitor, or the MLCC with low equivalent series resistance (ESR). However, the inventive concepts is not limited thereto. As described above, the auxiliary power supply 120 may be charged by the charging power Chr (refer to FIG. 1) provided through the PLP IC 110 and the charging power Chr (refer to FIG. 1) may be based on the external power Ext (refer to FIG. 1).

The charging operation of each of the capacitors 121 may be repeatedly performed with a particular (or, alternatively, predetermined) period. For example, the auxiliary power supply 120 may stop charging when a voltage level of each of the capacitors 121 reaches a first voltage level. When charging is stopped, a natural discharge phenomenon in which charges leak from the capacitors 121 little by little may occur so that the voltage level of each of the capacitors 121 may be gradually reduced. As the natural discharge phenomenon occurs, the voltage level of each of the capacitors 121 may reach a second voltage level lower than the first voltage level so that the auxiliary power supply 120 may perform charging again. The first voltage level and the second voltage level may be values preset by a user.

The electrical energy stored in the auxiliary power supply 120 may be calculated in accordance with the following equation 1.

$$E_c = \frac{1}{2}CV^2 \qquad \text{[EQUATION 1]}$$

wherein $E_c$ may represent the electrical energy stored in the auxiliary power supply 120, C may represent equivalent capacitance of the auxiliary power supply 120, and V may represent a charging voltage of the auxiliary power supply 120. Hereinafter, the capacitance of the auxiliary power supply 120 may mean equivalent capacitance of each of the capacitors 121 included in the auxiliary power supply 120. The charging voltage of the auxiliary power supply 120 may have a fixed constant value, and capacitance of each of the capacitors 121 may have a variable value. However, the constant value and the variable value may be measured in real time by the main system 130 (refer to FIG. 1) monitoring the auxiliary power supply 120. Therefore, the user may grasp the electrical energy $E_c$ charged in the auxiliary power supply 120 in real time. As the capacitance of each of the capacitors 121 is reduced, the electrical energy stored in the auxiliary power supply 120 may be reduced. As the auxiliary power supply 120 is used, the capacitance of the auxiliary power supply 120 may be reduced so that the voltage level of the internal power Int provided by the auxiliary power supply 120 may be reduced.

Figure 4:
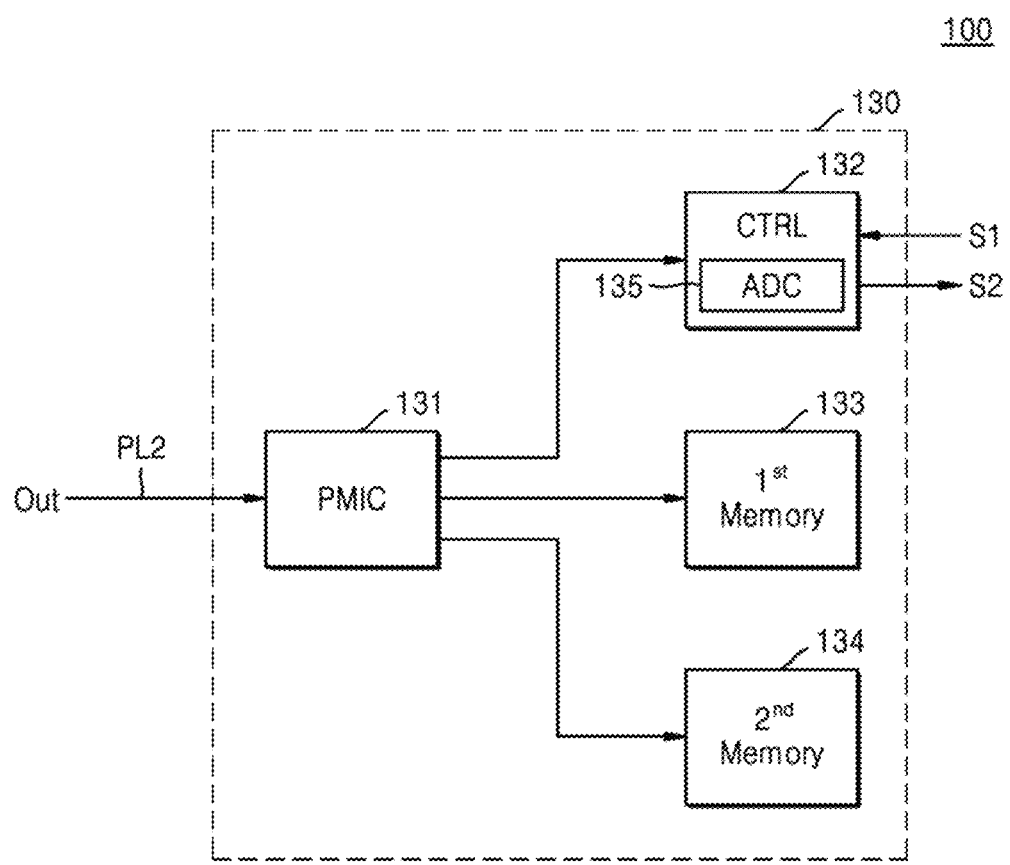
FIG. 4 is a block diagram illustrating a main system according to some example embodiments of the inventive concepts.

FIG. 4 is a block diagram illustrating a main system 130 according to some example embodiments of the inventive concepts. Specifically, FIG. 4 is a block diagram illustrating the main system 130 included in the storage device 100 of FIG. 1. Hereinafter, description will be given with reference to FIGS. 1 to 3 and previously given description will not be given again.

Referring to FIG. 4, the main system 130 may include a power management integrated circuit (PMIC) 131, a controller 132, first memory 133, and second memory 134.

The PMIC 131 may supply the output power Out supplied through the PLP IC 110 (refer to FIG. 1) to the main system 130. The PMIC 131 may receive the external power Ext or the internal power Int from the second power line PL2 and may generate output voltages suitable for operations of the controller 132, the first memory 133, and the second memory 134 to provide the generated output voltages to the controller 132, the first memory 133, and the second memory 134.

The controller 132 may control an operation of the PLP controller 111 (refer to FIG. 2). For example, the controller 132 may generate the power mode signal S2 controlling the PLP IC 110 (refer to FIG. 1) to operate in the external power supply mode or the internal power supply mode in response to the external power signal S1 received from the PLP controller 111 (refer to FIG. 2). In some example embodiments, the controller 132 may include a processor and operation memory and may control the PLP IC 110 (refer to FIG. 1) through a firmware operation. However, the inventive concepts is not limited thereto, and the controller 132 may control the PLP IC 110 (refer to FIG. 1) through a hardware or software operation.

The controller 132 may control data read, write, and erase operations of each of the first memory 133 and the second memory 134. For example, the controller 132 may control the first memory 133 and the second memory 134 to operate in the filtering mode or the dump mode based on at least one of the external power signal S1 received from the PLP IC 110 (refer to FIG. 1) or the voltage level of the internal power Int in the SPO situation. In some example embodiments, the controller 132 may be a micro-controller unit (MCU).

The controller 132 may include an analog-to-digital converter (ADC) 135. The ADC 135 may monitor a change in voltage level of the output power Out and a change in voltage level of the internal power Int. The controller 132 may control the first memory 133 and the second memory 134 to operate in the filtering mode or the dump mode based on the voltage level of the internal power Int, which is monitored by the ADC 135. The operation of the controller 132 will be specifically described later with reference to FIGS. 6 to 9.

The first memory 133 and the second memory 134 may be different kinds of memory. For example, the first memory 133 may be volatile memory and the second memory 134 may be non-volatile memory. For example, the first memory 133 may include at least one of static random access memory (SRAM) or dynamic RAM (DRAM). The second memory 134 may include at least one of flash memory, phase change RAM (PRAM), ferroelectric RAM (FRAM), or magnetic RAM (MRAM).

One of the first memory 133 or the second memory 134 may be cache memory, and the other may be main memory. For example, the first memory 133 may be cache memory and the second memory 134 may be main memory. When the first memory 133 is DRAM and the second memory 134 is NAND flash memory and the main system 130 operates in the dump mode, the controller 132 may control the first memory 133 and the second memory 134 so that data stored in the first memory 133 is backed up to the second memory 134.

In some example embodiments, the storage device 100 may be an SSD in accordance with a kind of the main memory. For example, when DRAM is used for the first memory 133 as the cache memory and NAND flash memory is used for the second memory 134 as the main memory, the storage device 100 may be an SSD. However, the inventive concepts is not limited thereto. Hereinafter, the operation of the storage device 100 will be described with reference to FIGS. 5 to 9.

Figure 5:
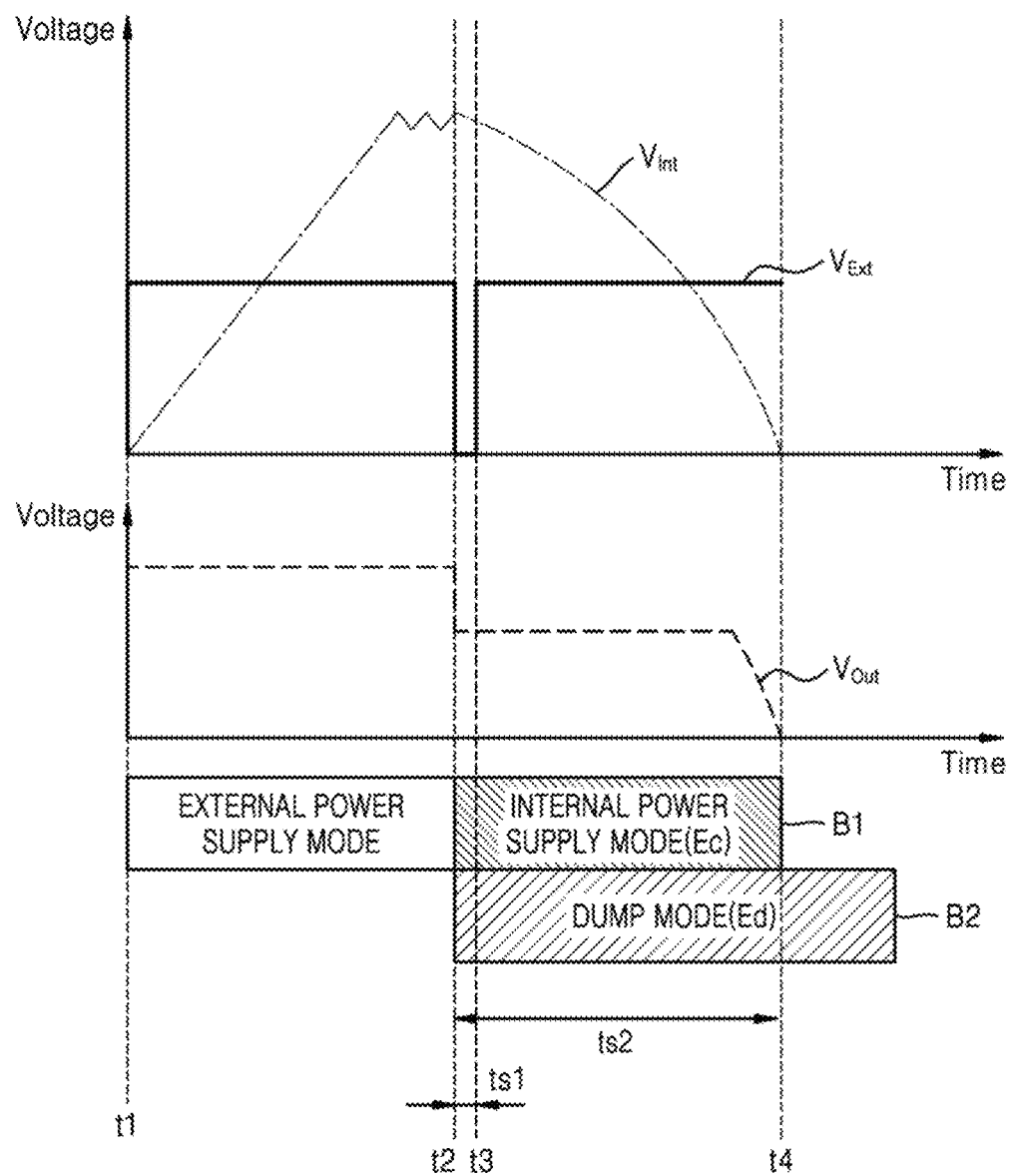
FIG. 5 is a view illustrating an operation of a conventional storage device according to some example embodiments of the inventive concepts.

FIG. 5 is a view illustrating an operation of a storage device according to some example embodiments of the inventive concepts. Hereinafter, description will be given with reference to FIGS. 1 to 3 together.

Referring to FIG. 5, the horizontal axis of a graph may represent time and the vertical axis thereof may represent a voltage level.

In a section from a first time t1 to a second time t2, the external power Ext (refer to FIG. 1) may be normally supplied to the PLP IC 110 (refer to FIG. 1). A level of a voltage $V_{Ext}$ of the external power Ext may be no less than the initially set minimum operation allowable voltage level. The level of the voltage $V_{Ext}$ of the external power Ext may maintain a constant value. For example, the voltage $V_{Ext}$ of the external power Ext may be 12 V.

Therefore, the PLP IC 110 (refer to FIG. 1) may operate in the external power supply mode and may output the external power Ext (refer to FIG. 1) as the output power Out (refer to FIG. 1). Therefore, a level of a voltage $V_{Out}$ of the output power Out may be the same as the level of the voltage $V_{Ext}$ of the external power.

When the PLP IC 110 (refer to FIG. 1) operates in the external power supply mode, the auxiliary power supply 120 (refer to FIG. 1) may perform the charging operation by using the external power Ext (refer to FIG. 1). Therefore, a level of a voltage $V_{Int}$ of the internal power Int may increase from the first time t1 toward the second time t2. That is, toward the second time t2, the auxiliary power supply 120 (refer to FIG. 1) may be fully charged.

At the second time t2, the external power Ext (refer to FIG. 1) may be abnormally supplied to the PLP IC 110 (refer to FIG. 1). That is, the level of the voltage $V_{Ext}$ of the external power Ext may be reduced to be less than the initially set minimum operation allowable voltage level. In other words, at the second time t2, the SPO may occur.

Therefore, the PLP IC 110 (refer to FIG. 1) may operate in the internal power supply mode, may convert the internal power Int (refer to FIG. 1) to have a constant voltage level, and may output the converted internal power Int as the output power Out (refer to FIG. 1). Therefore, the level of the voltage $V_{Int}$ of the internal power Int may be reduced from the second time t2 and the level of the voltage $V_{Out}$ of the output power Out may maintain a constant value from the second time t2 to a fourth time t4.

A block B1 below the graph of FIG. 5 may mean the electrical energy Ec charged in the auxiliary power supply 120 (refer to FIG. 1) so that the PLP IC 110 (refer to FIG. 1) operates in the internal power supply mode. The PLP IC 110 (refer to FIG. 1) may operate in the internal power supply mode for a time corresponding to the electrical energy Ec charged in the auxiliary power supply 120 (refer to FIG. 1). For example, when the electrical energy Ec charged in the auxiliary power supply 120 (refer to FIG. 1) is reduced, the time for which the PLP IC 110 (refer to FIG. 1) operates in the internal power supply mode may be reduced and, when all the electrical energy Ec charged in the auxiliary power supply 120 (refer to FIG. 1) is consumed, the storage device 100 (refer to FIG. 1) may be turned off. In FIG. 5, the PLP IC 110 (refer to FIG. 1) may operate in the internal power supply mode from the second time t2 to the fourth time t4.

The time for which the PLP IC 110 (refer to FIG. 1) operates in the internal power supply mode may vary. As described above with reference to FIG. 3, the capacitance of the auxiliary power supply 120 (refer to FIG. 1) may be reduced as the storage device 100 (refer to FIG. 1) is used so that the electrical energy Ec charged in the auxiliary power supply 120 (refer to FIG. 1) may also be reduced. Therefore, as the storage device 100 (refer to FIG. 1) is used, the time for which the PLP IC 110 (refer to FIG. 1) operates in the internal power supply mode may be reduced.

At the second time t2, as the PLP IC 110 (refer to FIG. 1) operates in the internal power supply mode, the main system 130 (refer to FIG. 1) may operate in the dump mode in which data is backed up. The main system 130 (refer to FIG. 1) may require a constant amount of electrical energy Ed to operate in the dump mode. A block B2 below the graph of FIG. 5 may mean the electrical energy Ed consumed by the main system 130 (refer to FIG. 1) to operate in the dump mode.

In most cases, the storage device 100 (refer to FIG. 1) is designed considering the electrical energy Ed consumed by the main system 130 (refer to FIG. 1) to operate in the dump mode and the electrical energy Ec charged in the auxiliary power supply 120 (refer to FIG. 1) to vary. However, as described above, the electrical energy Ec charged in the auxiliary power supply 120 (refer to FIG. 1) may be reduced as the storage device 100 (refer to FIG. 1) is used and, as illustrated in FIG. 5, the electrical energy Ec charged in the auxiliary power supply 120 (refer to FIG. 1) may be less than the electrical energy Ed consumed by the main system 130 (refer to FIG. 1) to operate in the dump mode.

In this case, although the external power Ext (refer to FIG. 1) is restored at the third time t3 so that a very short SPO time ts1 is required, because the PLP IC 110 (refer to FIG. 1) operates in the internal power supply mode and the main system 130 (refer to FIG. 1) operates in the dump mode at the second time t2, the electrical energy Ed may be unnecessarily consumed by the main system 130 (refer to FIG. 1) to operate in the dump mode.

In addition, as described above, when the electrical energy Ec charged in the auxiliary power supply 120 (refer to FIG. 1) is less than the electrical energy Ed consumed by the main system 130 (refer to FIG. 1) to operate in the dump mode, the storage device 100 (refer to FIG. 1) may be turned off while the main system 130 (refer to FIG. 1) operates in the dump mode. For example, at the fourth time t4 at which the main system 130 (refer to FIG. 1) operates in the dump mode, the main system 130 (refer to FIG. 1) operates in the dump mode, all the electrical energy Ec charged in the auxiliary power supply 120 (refer to FIG. 1) may be consumed and the storage device 100 (refer to FIG. 1) may be turned off without completely backing up data. Therefore, data that is not backed up to the main system 130 (refer to FIG. 1) and/or data that is being backed up to the main system 130 (refer to FIG. 1) may be lost and the reliability of the storage device (100 of FIG. 1) may be reduced.

In order to improve such a problem, the storage device according to some example embodiments of the inventive concepts may selectively operate in the dump mode. Hereinafter, the operation of the storage device according to some example embodiments of the inventive concepts will be described in detail with reference to FIGS. 6 to 8.

Figure 6:
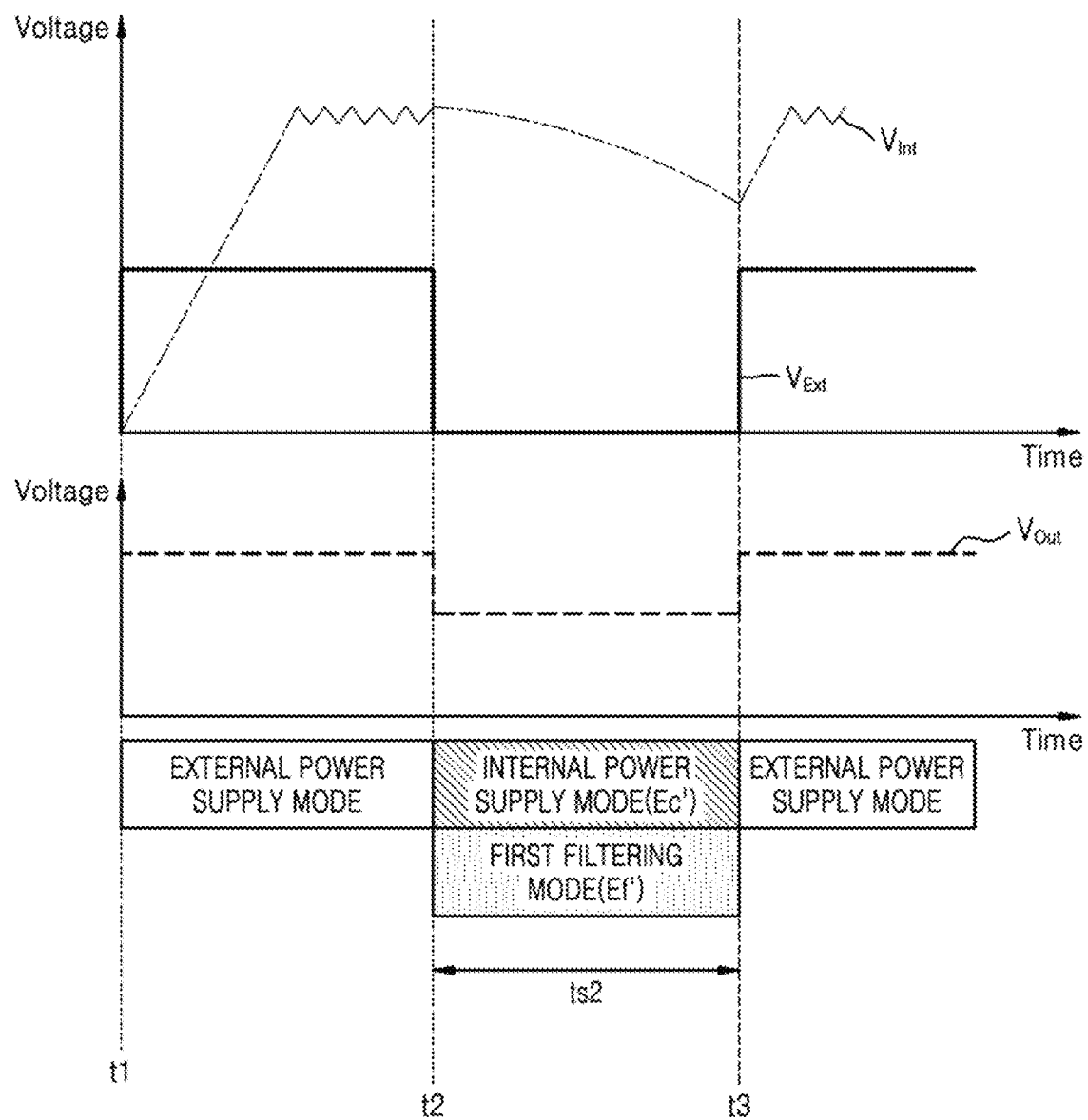
FIG. 6 is a view illustrating an operation of a storage device according to some example embodiments of the inventive concepts.

FIG. 6 is a view illustrating an operation of a storage device 100 according to some example embodiments of the inventive concepts. Specifically, FIG. 6 is a view illustrating the operation of the storage device 100 of FIG. 1. The same reference numerals as those of FIG. 5 are used for the first time t1 to the third time t3 of FIGS. 6, 7, and 8. However, the times t1 to t3 are for representing the order of times in a time axis and may not be the same as those of FIG. 5.

Hereinafter, description will be given with reference to FIGS. 1 to 4 and like reference numerals refer to like elements.

Referring to FIG. 6, in a section from the first time t1 to the second time t2, the level of the voltage $V_{Ext}$ of the external power Ext may be no less than the initially set minimum operation allowable voltage level. Therefore, the PLP IC 110 (refer to FIG. 1) may operate in the external power supply mode and the level of the voltage $V_{Out}$ of the output power Out may be the same as the level of the voltage $V_{Ext}$ of the external power Ext. When the PLP IC 110 (refer to FIG. 1) operates in the external power supply mode, the auxiliary power supply 120 (refer to FIG. 1) may perform the charging operation by using the external power Ext (refer to FIG. 1). Therefore, a level of a voltage $V_{Int}$ of the internal power Int may increase from the first time t1 toward the second time t2.

That is, at the second time t2, the level of the voltage $V_{Ext}$ of the external power Ext may be reduced to be less than the initially set minimum operation allowable voltage level. That is, at the second time t2, the SPO situation may occur. Therefore, the PLP IC 110 (refer to FIG. 1) may operate in the internal power supply mode, may convert the internal power Int (refer to FIG. 1) to have a constant voltage level, and may output the converted internal power Int as the output power Out (refer to FIG. 1). The level of the voltage $V_{Int}$ of the internal power Int may be reduced from the second time t2 and the level of the voltage $V_{Out}$ of the output power Out at the second time t2 may be lower than the level of the voltage $V_{Out}$ of the output power Out at the first time t1. For example, the level of the voltage $V_{Out}$ of the output power Out at the first time t1 may be 12 V and the level of the voltage $V_{Out}$ of the output power Out at the second time t2 may be 8 V. The level of the voltage $V_{Out}$ of the output power Out may maintain a constant value.

The main system 130 (refer to FIG. 1) may operate in the filtering mode while the PLP IC 110 (refer to FIG. 1) operates in the internal power supply mode. The main system 130 (refer to FIG. 1) may continuously perform (e.g., continue to perform without interruption) an operation that is being performed in the filtering mode although the power supply mode of the PLP IC 110 (refer to FIG. 1) changes from the external power supply mode to the internal power supply mode. When an SPO time ts2 (e.g., a value and/or magnitude of duration of the SPO time) is shorter than the maximum filtering time $t_{mf}$, the main system 130 (refer to FIG. 1) may not operate in the dump mode. The maximum filtering time $t_{mf}$ may be calculated by using the following Equations 2 to 4.

$$E_c = E_f + E_d \qquad \text{[EQUATION 2]}$$

$$E_d = P_w \times t_{wd} \qquad \text{[EQUATION 3]}$$

$$t_{mf} = \frac{E_f}{P_w} \qquad \text{[EQUATION 4]}$$

In Equation 2, $E_c$ may represent the electrical energy stored in the auxiliary power supply 120 (refer to FIG. 1), $E_f$ may represent the electrical energy consumed by the main system 130 (refer to FIG. 1) to operate in the filtering mode, and Ea may represent the electrical energy consumed by the main system 130 (refer to FIG. 1) to operate in the dump mode. The electrical energy $E_c$ stored in the auxiliary power supply 120 (refer to FIG. 1) may be calculated by using Equation 1. Referring to Equation 1, the charging voltage V of the auxiliary power supply 120 may have a fixed constant value and the capacitance C of the auxiliary power supply 120 may have a variable value. However, because the constant value and the variable value may be measured in real time by the main system 130 monitoring the auxiliary power supply 120, the user may determine the electrical energy $E_c$ stored in the auxiliary power supply 120 (refer to FIG. 1).

In Equation 3, $P_w$ may represent the maximum value of the power consumed when the main system 130 (refer to FIG. 1) operates and $t_{wd}$ may represent the maximum value of a time taken for the main system 130 (refer to FIG. 1) to back up all data while operating in the dump mode. The maximum value $P_w$ of the power consumed when the main system 130 (refer to FIG. 1) operates and the maximum value $t_{wd}$ of the time taken for the main system 130 (refer to FIG. 1) to back up all the data while operating in the dump mode may be constants preset by the user. Therefore, the electrical energy $E_d$ consumed by the main system 130 (refer to FIG. 1) to operate in the dump mode may have a particular (or, alternatively, predetermined) value.

In Equation 4, $t_{mf}$ represents the maximum filtering time. The maximum filtering time $t_{mf}$ may have a value obtained by dividing the electrical energy $E_f$ consumed by the main system 130 (refer to FIG. 1) to operate in the filtering mode by the maximum value $P_w$ of the power consumed when the main system 130 (refer to FIG. 1) operates. The maximum value Pw of the power consumed when the main system 130 (refer to FIG. 1) operates may be the constant preset by the user as described above and the electrical energy $E_f$ consumed by the main system 130 (refer to FIG. 1) to operate in the filtering mode may be calculated by using the equations 2 and 3.

At the third time t3, the external power Ext (refer to FIG. 1) may be restored. Therefore, the PLP IC 110 (refer to FIG. 1) may operate in the external power supply mode again and the auxiliary power supply 120 (refer to FIG. 1) may perform the charging operation by using the external power Ext (refer to FIG. 1). The level of the voltage $V_{Int}$ of the internal power Int may increase again from the third time t3.

In FIG. 6, the SPO time ts2 may be shorter than the maximum filtering time $t_{mf}$. Therefore, the main system 130 (refer to FIG. 1) may not back up data and may not waste the electrical energy consumed when the main system 130 (refer to FIG. 1) operates in the dump mode.

Electrical energy Ec' consumed by the PLP IC 110 (refer to FIG. 1) to operate in the internal power supply mode from the second time t2 to the third time t3 may be less than the electrical energy $E_c$ (refer to Equation 1) charged in the auxiliary power supply 120 (refer to FIG. 1) and may be equal to electrical energy $E_f'$ consumed by the main system 130 (refer to FIG. 1) to operate in the filtering mode from the second time t2 to the third time t3.

According to the inventive concepts, the main system 130 (refer to FIG. 1) operates in the filtering mode while the PLP IC 110 (refer to FIG. 1) operates in the internal power supply mode at the second time t2 and selectively operates in the dump mode only when a certain condition is satisfied so that it is possible to prevent the electrical energy from being unnecessarily consumed and to increase the reliability of the storage device 100 (refer to FIG. 1). Hereinafter, the condition under which the main system 130 (refer to FIG. 1) operates in the dump mode will be described in detail with reference to FIGS. 7 and 8.

Figure 7:
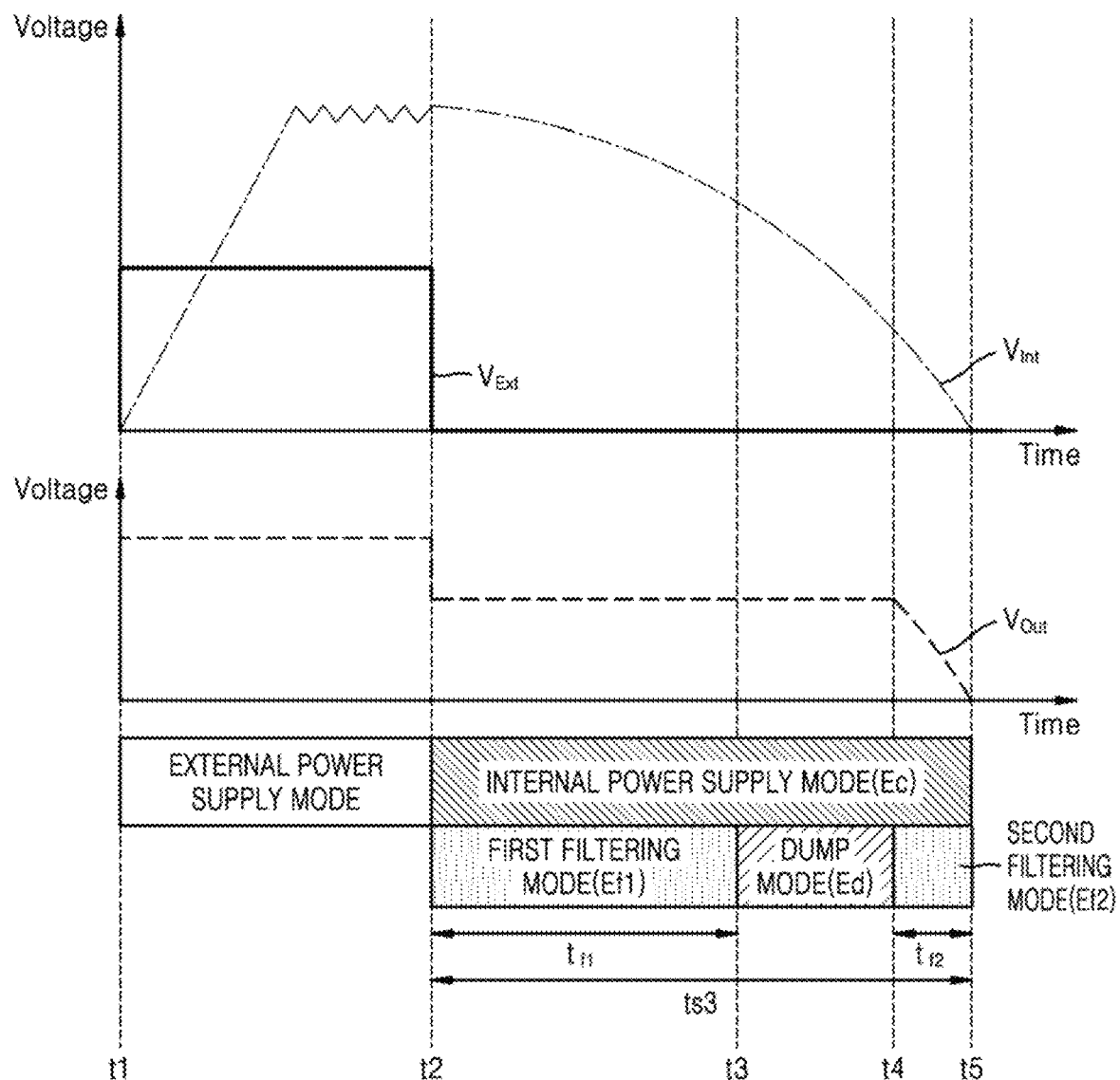
FIG. 7 is a view illustrating an operation of a storage device according to some example embodiments of the inventive concepts.

FIG. 7 is a view illustrating an operation of a storage device 100 according to some example embodiments of the inventive concepts. Specifically, FIG. 7 is a view illustrating a first condition under which the main system 130 of FIG. 1 operates in the dump mode. Hereinafter, description will be given with reference to FIGS. 1 to 6 based on a difference with FIG. 6 and like reference numerals refer to like elements.

Referring to FIG. 7, unlike some example embodiments, including the example embodiments shown in FIG. 6, at the second time t2, after the SPO occurs, the external power Ext (refer to FIG. 1) may not be restored. Therefore, an SPO time ts3 (e.g., a value and/or magnitude of duration of the SPO time) may be longer than the maximum filtering time $t_{mf}$.

The PLP IC 110 (refer to FIG. 1) may operate in the internal power supply mode from the second time t2 until all the electrical energy Ec stored in the auxiliary power supply 120 (refer to FIG. 1) is consumed. The electrical energy $E_c$ stored in the auxiliary power supply may be equal to the sum of electrical energy $E_{f1}$ consumed by the main system to operate in a first filtering mode, the electrical energy $E_d$ consumed by the main system to operate in the dump mode, and electrical energy $E_{f2}$ consumed by the main system to operate in a second filtering mode ($E_c = E_{f1} + E_d + E_{f2}$).

The SPO time ts3 may be determined based on the level (e.g., magnitude) of the voltage $V_{Ext}$ of the external power Ext. For example, the SPO time ts3 may be determined based on a time for which the level of the voltage $V_{Ext}$ of the external power is maintained to be no more than the level of the initially set minimum operation allowable voltage level. The maximum filtering time $t_{mf}$ may be calculated by using the above-described equations 1 to 4 and may be illustrated in equation 5 as follows.

$$t_{mf} = t_{f1} + t_{f2} \quad \text{[EQUATION 5]}$$

In Equation 5, to may represent the time for which the main system 130 (refer to FIG. 1) operates in the first filtering mode and $t_{f2}$ may represent the time for which the main system 130 (refer to FIG. 1) operates in the second filtering mode. A ratio between the time to for which the main system 130 (refer to FIG. 1) operates in the first filtering mode and the time $t_{f2}$ for which the main system 130 (refer to FIG. 1) operates in the second filtering mode may be set by the user. For example, the ratio between the time $t_{f1}$ for which the main system 130 (refer to FIG. 1) operates in the first filtering mode and the time $t_{f2}$ for which the main system 130 (refer to FIG. 1) operates in the second filtering mode may be 9:1.

In some example embodiments according to the inventive concepts, the main system 130 (refer to FIG. 1) operates in the first filtering mode and operates in the dump mode from the third time t3 at which the SPO time ts3 is equal to the maximum filtering time $t_{mf}$ so that it is possible to prevent the main system 130 (refer to FIG. 1) from operating in the dump mode when it is not necessary to back up data like when the external power Ext (refer to FIG. 1) is rapidly restored. As a result, unnecessary energy consumption can be prevented, thereby improving energy efficiency of the storage device 100, reducing unnecessary power consumption by the storage device, improving reliability based on reducing the risk of recognition defect of the storage device 100 due to total depletion of the internal power Int during the dump mode operation, and thus improving reliability, performance, and functionality of the storage device 100.

In addition, by performing the second filtering mode after performing the dump mode, the storage device 100 (refer to FIG. 1) may not be turned off while performing the dump mode. Therefore, it is possible to prevent the loss of data being backed up or data not backed up in advance. That is, because the main system 130 (refer to FIG. 1) operates in the second filtering mode after operating in the dump mode, although electrical energy having a value greater than a calculated value is required when the main system 130 (refer to FIG. 1) operates in the dump mode or the electrical energy Ec stored in the auxiliary power supply 120 (refer to FIG. 1) is reduced, the main system 130 (refer to FIG. 1) may normally operate in the dump mode.

Figure 8:
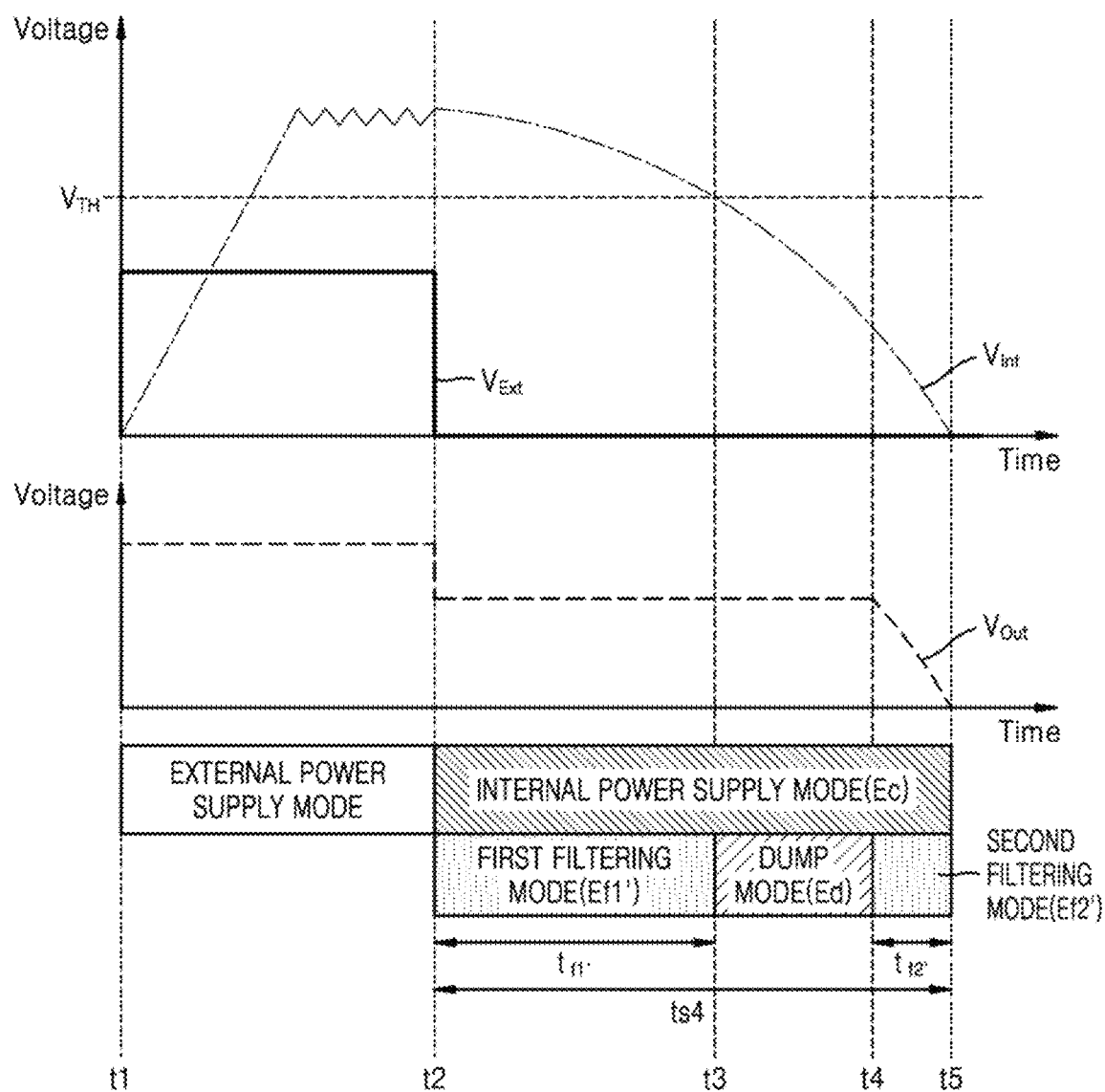
FIG. 8 is a view illustrating an operation of a storage device according to some example embodiments of the inventive concepts.

FIG. 8 is a view illustrating an operation of a storage device 100 according to some example embodiments of the inventive concepts. Specifically, FIG. 8 is a view illustrating a second condition under which the main system 130 of FIG. 1 operates in the dump mode. Hereinafter, description will be given with reference to FIGS. 1 to 6 based on a difference with FIG. 6 and like reference numerals refer to like elements.

Referring to FIG. 8, unlike some example embodiments, including the example embodiments shown in FIG. 6, at the second time t2, after the SPO occurs, the external power Ext (refer to FIG. 1) may not be restored. Therefore, the PLP IC 110 (refer to FIG. 1) may operate in the internal power supply mode from the second time t2 until all the electrical energy Ec stored in the auxiliary power supply 120 (refer to FIG. 1) is consumed. That is, the electrical energy $E_c$ stored in the auxiliary power supply may be equal to the sum of electrical energy $E_{f1}'$ consumed by the main system to operate in a first filtering mode, the electrical energy $E_d$ consumed by the main system to operate in the dump mode, and electrical energy $E_{f2}'$ consumed by the main system to operate in a second filtering mode ($E_c=E_{f1}+E_d+E_{f2}'$).

At the third time t3, the level of the voltage $V_{Int}$ of the internal power may be the same as a level of a threshold voltage $V_{TH}$ and, after the third time t3, the level of the voltage $V_{Int}$ of the internal power may be lower than the level of the threshold voltage $V_{TH}$. The level of the threshold voltage $V_{TH}$ may be higher than the level of the voltage $V_{Ext}$ of the external power.

As illustrated in equation 6, the threshold voltage $V_{TH}$ may be proportional to the electrical energy $E_f$ consumed by the main system 130 (refer to FIG. 1) to operate in the filtering mode and may be inversely proportional to the capacitance of the auxiliary power supply 120 (refer to FIG. 1).

$$V_{TH} \propto \frac{2 \times E_F}{C} \quad \text{[EQUATION 6]}$$

When the voltage $V_{Int}$ of the internal power is no more than the level of the threshold voltage $V_{TH}$, the main system 130 (refer to FIG. 1) may operate in the dump mode. The electrical energy $E_{f1}'$ consumed by the main system 130 (refer to FIG. 1) to operate in the first filtering mode in FIG. 8 may be equal to or different from the electrical energy $E_{f1}$ consumed by the main system 130 (refer to FIG. 1) to operate in the first filtering mode in FIG. 7. A ratio between the time $t_{f1}'$ for which the main system 130 (refer to FIG. 1) operates in the first filtering mode and the time $t_{f2}'$ for which the main system 130 (refer to FIG. 1) operates in the second filtering mode in FIG. 8 may be equal to or different from the ratio between the time $t_{f1}$ for which the main system 130 (refer to FIG. 1) operates in the first filtering mode and the time $t_{f2}$ for which the main system 130 (refer to FIG. 1) operates in the second filtering mode in FIG. 7.

In some example embodiments according to the inventive concepts, the main system 130 (refer to FIG. 1) operates in the dump mode based on the level of the voltage $V_{int}$ of the internal power source. Accordingly, the storage device 100 (refer to FIG. 1) may not be turned off while performing the dump mode. Therefore, it is possible to prevent the loss of data being backed up or data not backed up in advance.

Figure 9:
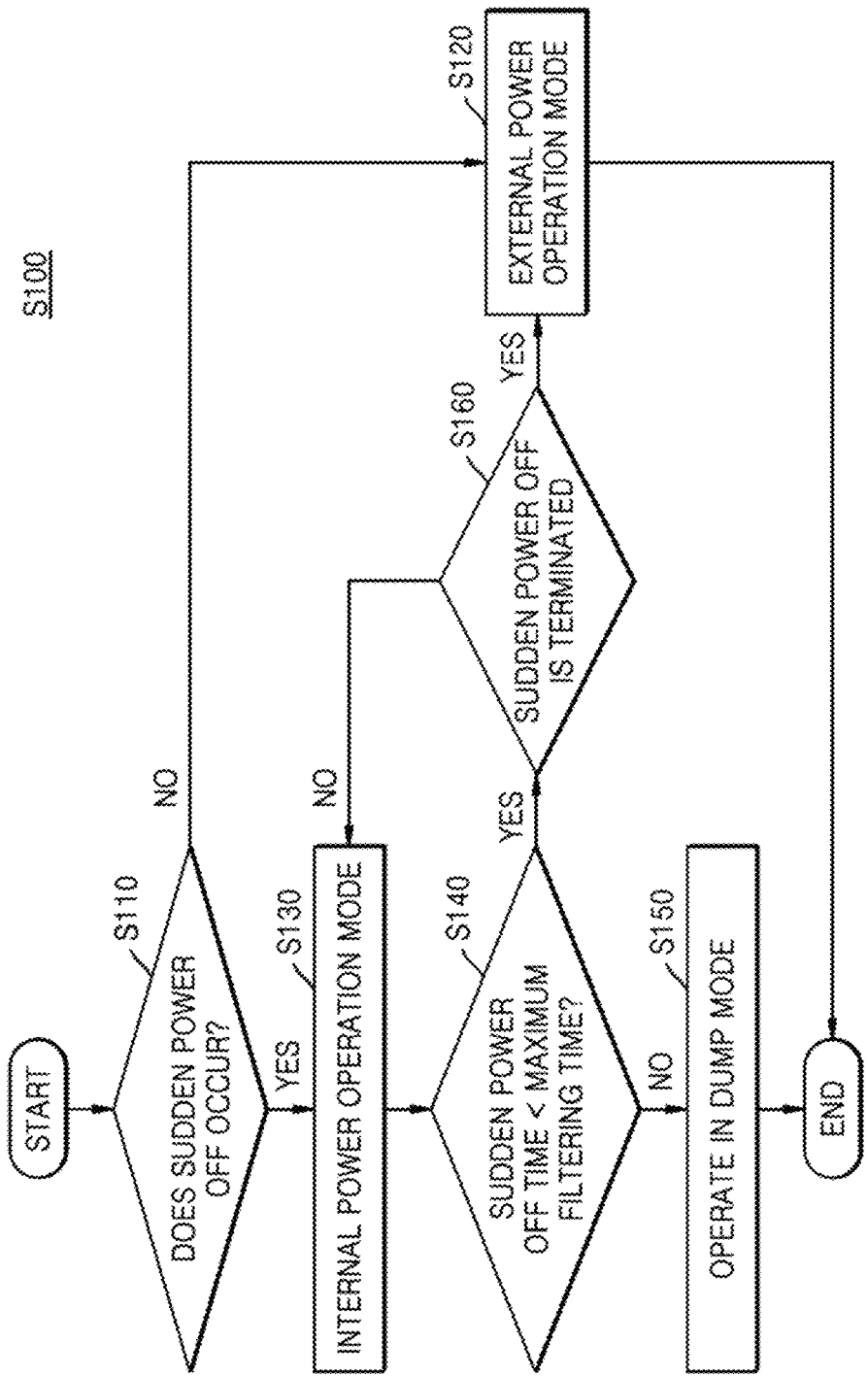
FIG. 9 is a flowchart illustrating an operation of a storage device according to some example embodiments of the inventive concepts.

FIG. 9 is a flowchart illustrating an operation of a storage device 100 according to some example embodiments of the inventive concepts. Specifically, FIG. 9 is a flowchart illustrating the operation of the storage device 100 of FIG. 1. Hereinafter, description will be given with reference to FIGS. 1 to 8.

Referring to FIG. 9, a storage device operating method S100 may include operations S110, S120, S130, S140, S150, and S160.

In operation S110, the PLP IC 110 (refer to FIG. 1) may monitor a change in voltage level of the external power and may transmit the monitoring result to the main system 130 (refer to FIG. 1). The controller 132 (refer to FIG. 4) may determine whether an SPO occurs based on the external power signal S1 (refer to FIG. 4) received from the PLP IC 110 (refer to FIG. 1). The SPO may mean that the voltage level of the external power is less than the initially set minimum operation allowable voltage level.

In operation S120, when an SPO does not occur, the controller 132 (refer to FIG. 4) may generate the power mode signal S2 (refer to FIG. 4) controlling the PLP IC 110 (refer to FIG. 1) to operate in the external power supply mode. Therefore, the PLP IC 110 (refer to FIG. 1) may operate in the external power supply mode and may provide the external power Ext (refer to FIG. 1) to the main system 130 (refer to FIG. 1) as the output power Out (refer to FIG. 1).

In operation S130, when an SPO occurs, the controller 132 (refer to FIG. 4) may generate the power mode signal S2 (refer to FIG. 4) controlling the PLP IC 110 (refer to FIG. 1) to operate in the internal power supply mode. Therefore, the PLP IC 110 (refer to FIG. 1) may operate in the internal power supply mode and may provide the internal power Int (refer to FIG. 1) converted to have a constant voltage level to the main system 130 (refer to FIG. 1) as the output power Out (refer to FIG. 1).

At this time, the main system 130 (refer to FIG. 1) may operate in the filtering mode. That is, the controller 132 (refer to FIG. 4) may control the first memory 133 (refer to FIG. 4) and the second memory 134 (refer to FIG. 4) to continuously perform operations that are being performed based on the internal power Int (refer to FIG. 1).

In operation S140, the controller 132 (refer to FIG. 4) may measure the SPO time ts2 (refer to FIG. 6). The SPO time ts2 (refer to FIG. 6) may be determined based on the external power signal S1 (refer to FIG. 4) received from the PLP IC 110 (refer to FIG. 1). The controller 132 (refer to FIG. 4) may determine whether the SPO time ts2 (refer to FIG. 6) is shorter than the maximum filtering time $t_{mf}$ (refer to Equation 4). The maximum filtering time $t_{mf}$ may be calculated by using Equations 1 to 4 described above.

In operation S150, when the SPO time is longer than the maximum filtering time (ts3 of FIG. 7>$t_{mf}$ of Equation 4), the main system 130 (refer to FIG. 1) may operate in the dump mode from a time (the third time t3 of FIG. 7) at which the SPO time is equal to the maximum filtering time. Therefore, the controller 132 (refer to FIG. 4) may back up data (e.g., the main system 130 may be caused to back up data) from the time (the third time t3 of FIG. 7) at which the SPO time is equal to the maximum filtering time.

In operation S160, when the SPO time is shorter than the maximum filtering time (ts2 of FIG. 6<$t_{mf}$ of Equation 4), the controller 132 (refer to FIG. 4) may determine whether an SPO is terminated. It may be determined based on the external power signal S1 (refer to FIG. 4) received from the PLP IC 110 (refer to FIG. 1) whether the SPO is terminated.

When it is determined that the SPO is not terminated, operation S130 may be performed again. Therefore, the PLP IC 110 (refer to FIG. 1) may operate in the internal power operation mode and may provide the internal power Int (refer to FIG. 1) converted to have a constant voltage level to the main system 130 (refer to FIG. 1) as the output power Out (refer to FIG. 1).

When it is determined that the SPO is terminated, operation S120 may be performed. Therefore, the PLP IC 110 (refer to FIG. 1) may operate in the external power operation mode and may provide the external power Ext (refer to FIG. 1) to the main system 130 (refer to FIG. 1) as the output power Out (refer to FIG. 1). In this case, the controller 132 (refer to FIG. 4) may control the first memory 133 (refer to FIG. 4) and the second memory 134 (refer to FIG. 4) to continuously perform operations that are being performed.

Figure 10:
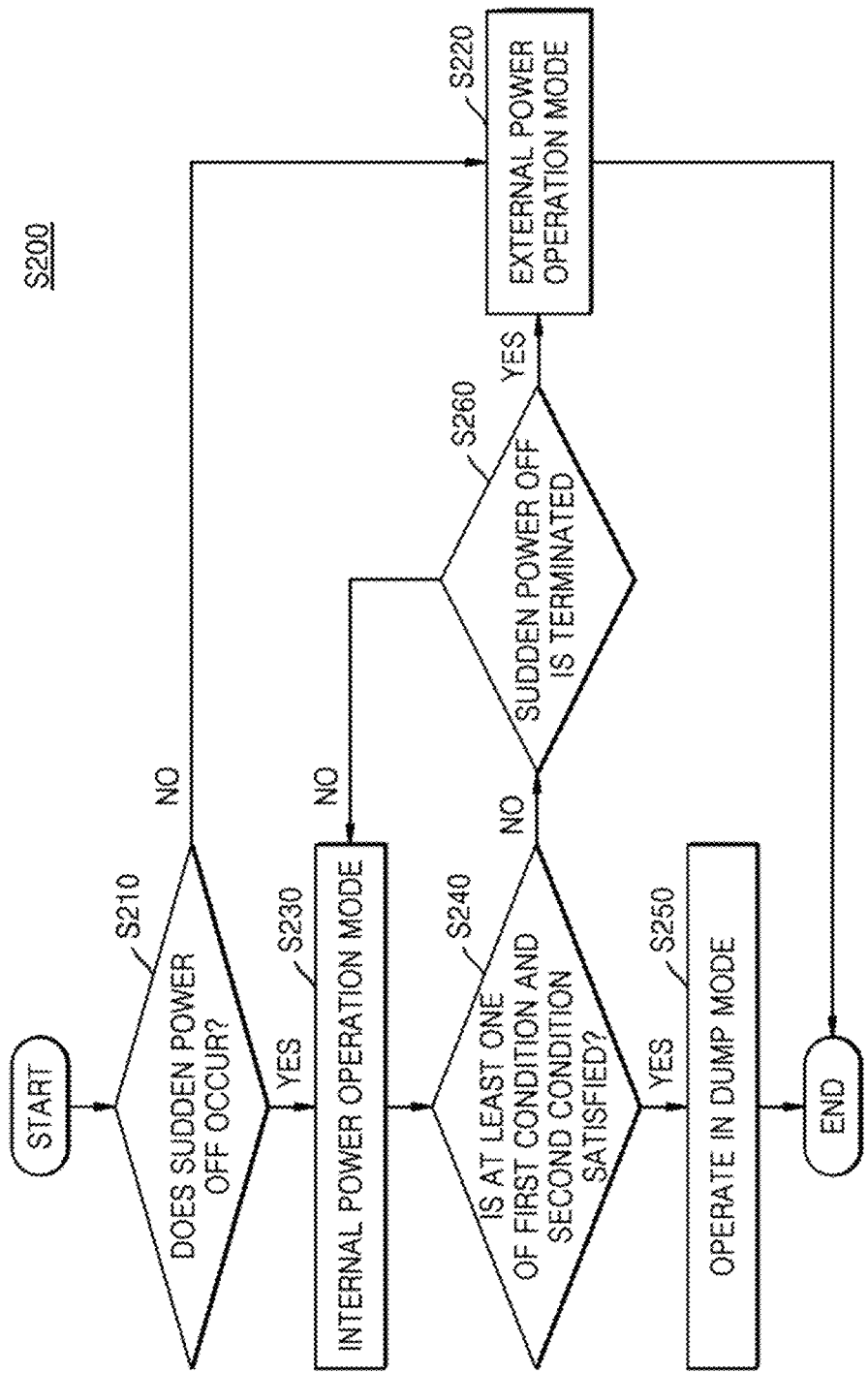
FIG. 10 is a flowchart illustrating an operation of a storage device according to some example embodiments of the inventive concepts.
Figure 11:
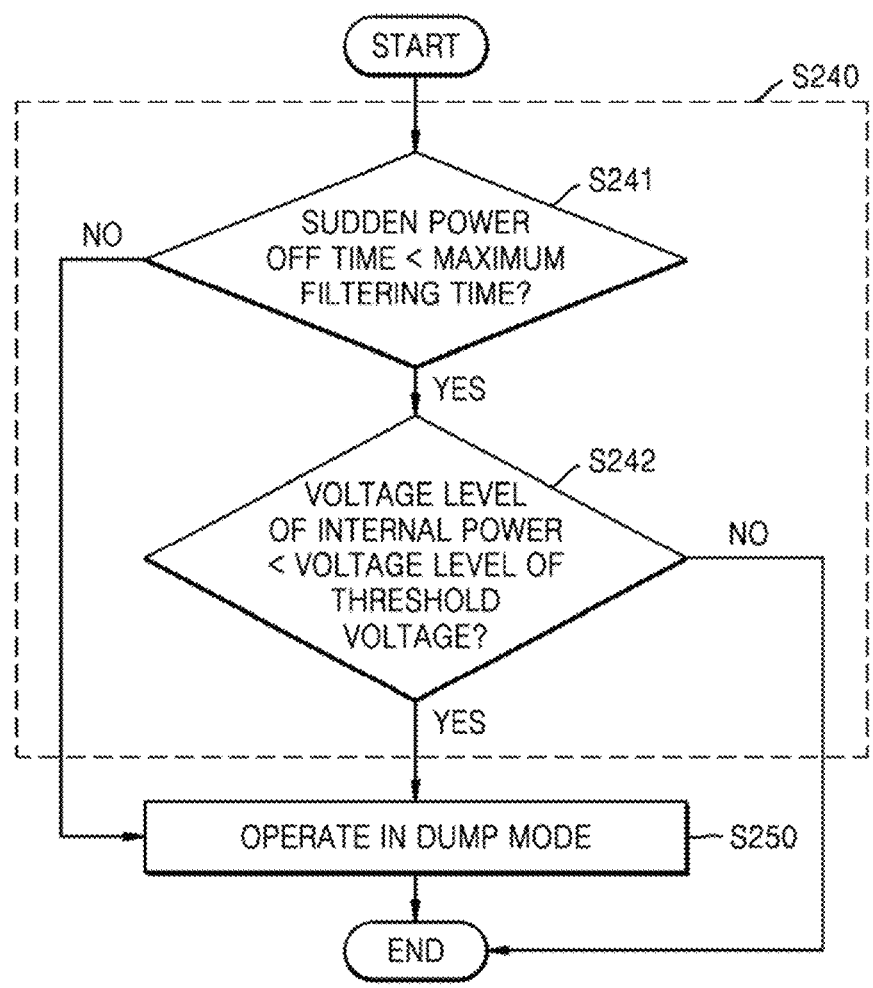
FIG. 11 is a flowchart illustrating an operation of a storage device according to some example embodiments of the inventive concepts.

FIGS. 10 and 11 are flowcharts each illustrating an operation of a storage device 100 according to some example embodiments of the inventive concepts. Specifically, FIG. 10 is a flowchart illustrating the operation of the storage device 100 of FIG. 1 and FIG. 11 is a flowchart illustrating operation S240 of FIG. 10 in more detail. Hereinafter, description will be given with reference to FIGS. 1 to 9 based on a difference with FIG. 9.

Referring to FIG. 10, a storage device operating method S200 may include operations S210, S220, S230, S240, S250, and S260.

In operation S210, the PLP IC 110 (refer to FIG. 1) may monitor a change in voltage level of the external power and may transmit the monitoring result to the main system 130 (refer to FIG. 1). The controller 132 (refer to FIG. 4) may determine whether an SPO occurs based on the external power signal S1 (refer to FIG. 4) received from the PLP IC 110 (refer to FIG. 1). The SPO may mean that the voltage level of the external power is less than the initially set minimum operation allowable voltage level.

In operation S220, when the SPO does not occur, the controller 132 (refer to FIG. 4) may generate the power mode signal S2 (refer to FIG. 4) controlling the PLP IC 110 (refer to FIG. 1) to operate in the external power supply mode. Therefore, the PLP IC 110 (refer to FIG. 1) may operate in the external power supply mode and may provide the external power Ext (refer to FIG. 1) to the main system 130 (refer to FIG. 1) as the output power Out (refer to FIG. 1).

In operation S230, when the SPO occurs, the controller 132 (refer to FIG. 4) may generate the power mode signal S2 (refer to FIG. 4) controlling the PLP IC 110 (refer to FIG. 1) to operate in the internal power supply mode. Therefore, the PLP IC 110 (refer to FIG. 1) may operate in the internal power supply mode and may provide the internal power Int (refer to FIG. 1) converted to have a constant voltage level to the main system 130 (refer to FIG. 1) as the output power Out (refer to FIG. 1).

At this time, the main system 130 (refer to FIG. 1) may operate in the filtering mode. That is, the controller 132 (refer to FIG. 4) may control the first memory 133 (refer to FIG. 4) and the second memory 134 (refer to FIG. 4) to continuously perform operations that are being performed based on the internal power Int (refer to FIG. 1).

In operation S240, the controller 132 (refer to FIG. 4) may determine whether at least one of the first condition or the second condition is satisfied. The operation S240 will be described in more detail with reference to FIG. 11.

Referring to FIG. 11, in operation S241, the controller 132 (refer to FIG. 4) may measure the SPO time ts2 (refer to FIG. 6). The SPO time ts2 (refer to FIG. 6) may be determined based on the external power signal S1 (refer to FIG. 4) received from the PLP IC 110 (refer to FIG. 1). The controller 132 (refer to FIG. 4) may determine whether the SPO time ts2 (refer to FIG. 6) is shorter than the maximum filtering time $t_{mf}$ (refer to Equation 4). That is, the first condition may be satisfied when the SPO time ts2 (refer to FIG. 6) is shorter than the maximum filtering time $t_{mf}$ (refer to Equation 4). The maximum filtering time $t_m f$ may be calculated by using Equations 1 to 4 described above.

In operation S242, when the SPO time is shorter than the maximum filtering time (ts2 of FIG. 6<$t_{mf}$ of Equation 4), the controller 132 (refer to FIG. 4) may determine whether the level of the voltage $V_{Int}$ (refer to FIG. 8) of the internal power is lower than the level of the threshold voltage $V_{TH}$ (refer to FIG. 8). That is, the second condition may be satisfied when the level of the voltage $V_{Int}$ (refer to FIG. 8) of the internal power is lower than the level of the threshold voltage $V_{TH}$ (refer to FIG. 8). As described above with reference to Equation 6, the level of the threshold voltage $V_{TH}$ (refer to FIG. 8) may be proportional to electrical energy obtained by subtracting the electrical energy consumed by the main system 130 (refer to FIG. 1) to operate in the dump mode from the electrical energy charged in the auxiliary power supply 120 (refer to FIG. 1) and may be inversely proportional to the capacitance of the auxiliary power supply 120 (refer to FIG. 1).

Referring to FIG. 10 again, in operation S250, when at least one of the first condition or the second condition is satisfied, the main system 130 (refer to FIG. 1) may operate in the dump mode. That is, when the level of the voltage $V_{Int}$ (refer to FIG. 8) of the internal power is lower than the level of the threshold voltage $V_{TH}$ (refer to FIG. 8), the main system 130 (refer to FIG. 1) may operate in the dump mode from a time at which the level of the voltage $V_{Int}$ (refer to FIG. 8) of the internal power is the same as the level of the threshold voltage $V_{TH}$ (refer to FIG. 8). The controller 132 (refer to FIG. 4) may control the first memory 133 (refer to FIG. 4) and the second memory 134 (refer to FIG. 4) to back up data from the time at which the level of the voltage $V_{Int}$ (refer to FIG. 8) of the internal power is the same as the level of the threshold voltage $V_{TH}$ (refer to FIG. 8).

In addition, when the SPO time is longer than the maximum filtering time (ts3 of FIG. 7>$t_{mf}$ of Equation 4), the main system 130 (refer to FIG. 1) may operate in the dump mode from the time (the third time t3 of FIG. 7) at which the SPO time is equal to the maximum filtering time. The controller 132 (refer to FIG. 4) may control the first memory 133 (refer to FIG. 4) and the second memory 134 (refer to FIG. 4) to back up data from the time (the third time t3 of FIG. 7) at which the SPO time is equal to the maximum filtering time.

In operation S260, when both the first condition and the second condition are not satisfied, the controller 132 (refer to FIG. 4) may determine whether an SPO is terminated. It may be determined based on the external power signal S1 (refer to FIG. 4) received from the PLP IC 110 (refer to FIG. 1) whether the SPO is terminated.

When it is determined that the SPO is not terminated, operation S230 may be performed again. Therefore, the PLP IC 110 (refer to FIG. 1) may operate in the internal power operation mode and may provide the internal power Int (refer to FIG. 1) converted to have a constant voltage level to the main system 130 (refer to FIG. 1) as the output power Out (refer to FIG. 1).

When it is determined that the SPO is terminated, operation S220 may be performed. Therefore, the PLP IC 110 (refer to FIG. 1) may operate in the external power operation mode and may provide the external power Ext (refer to FIG. 1) to the main system 130 (refer to FIG. 1) as the output power Out (refer to FIG. 1). In this case, the controller 132 (refer to FIG. 4) may control the first memory 133 (refer to FIG. 4) and the second memory 134 (refer to FIG. 4) to continuously perform operations that are being performed.

According to some example embodiments of the inventive concepts, the main system 130 (refer to FIG. 1) may operate in the dump mode only when at least one of the first condition or the second condition is satisfied. The first condition may be satisfied when the SPO time is longer than the maximum filtering time and the second condition may be satisfied when the voltage level of the internal power is lower than the voltage level of the threshold voltage. That is, the main system 130 (refer to FIG. 1) may operate in the dump mode based on at least one of an SPO time or the voltage level of the internal power Int.

Figure 12:
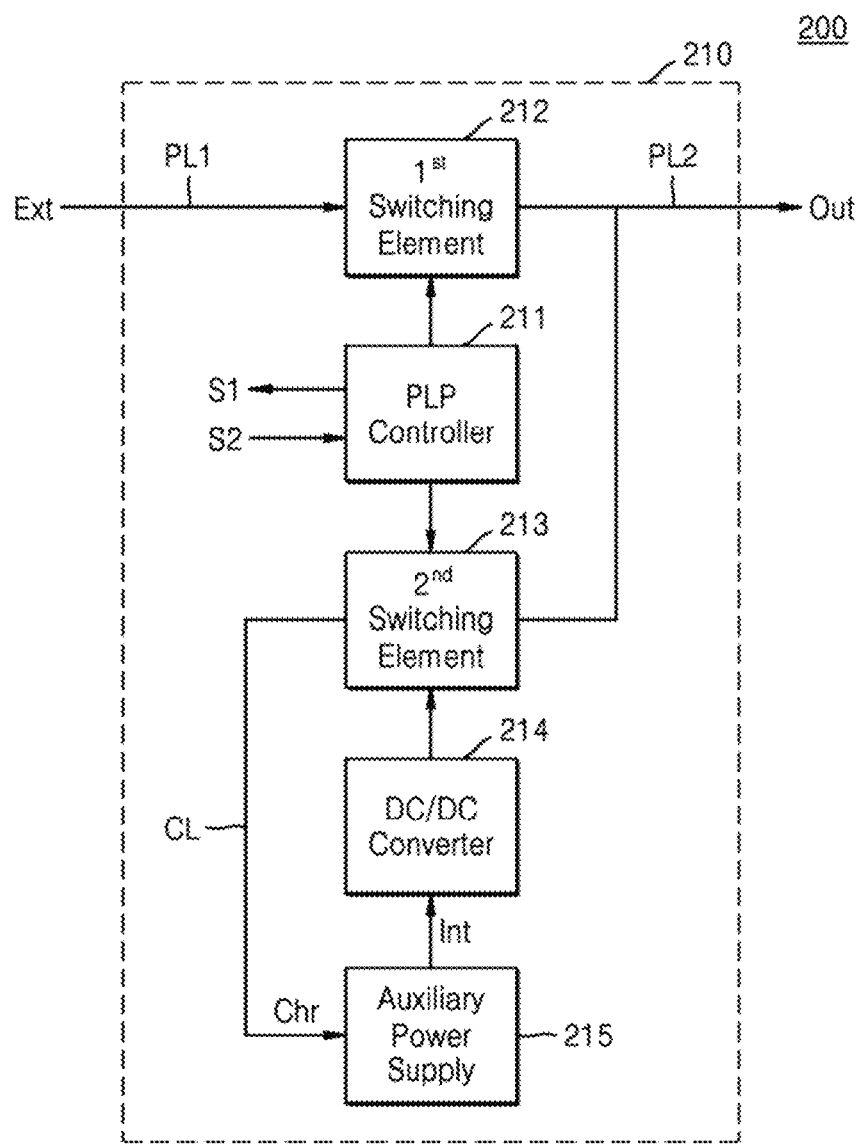
FIG. 12 is a block diagram illustrating a storage device according to some example embodiments of the inventive concepts.

FIG. 12 is a block diagram illustrating a PLP IC 210 according to some example embodiments of the inventive concepts. Specifically, FIG. 12 is a block diagram illustrating some example embodiments of the PLP IC 110 of FIGS. 1 and 2. Hereinafter, description will be given with reference to FIGS. 1 and 3 based on a difference with FIG. 2.

Referring to FIG. 12, a storage device 200 may include the PLP IC 210 and the main system 130 (refer to FIG. 1). The PLP IC 210 may provide output power Out to the main system 130 (refer to FIG. 1), and the main system 130 (refer to FIG. 1) may perform an operation by using the output power Out received from the PLP IC 210. Components of the main system 130 of FIG. 1 may be the same as those of the main system 130 of FIG. 4.

The PLP IC 210 may include a PLP controller 211, a first switching element 212, a second switching element 213, a DC/DC converter 214, and an auxiliary power supply 215. In FIG. 2, the PLP IC 110 is illustrated as being distinguished from the auxiliary power supply 120. However, as illustrated in FIG. 11, the auxiliary power supply 215 may be included in the PLP IC 210.

Figure 13:
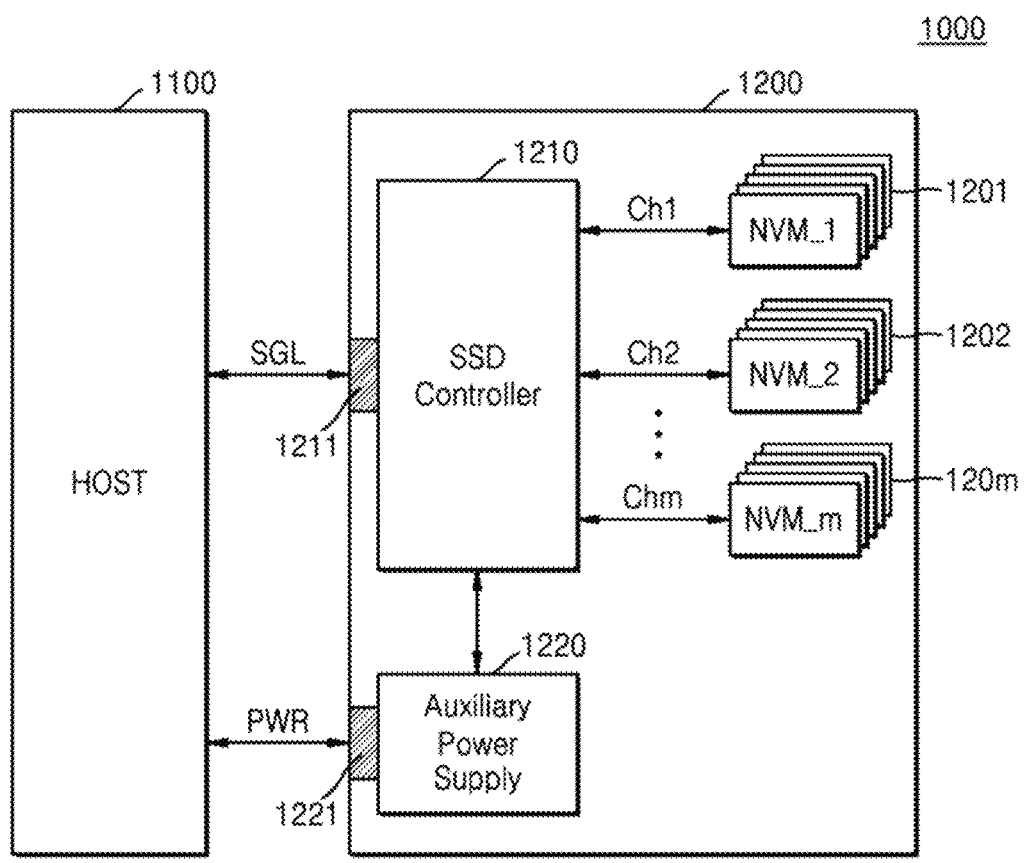
FIG. 13 is a block diagram illustrating a solid state drive (SSD) system including a storage device according to some example embodiments of the inventive concepts.

FIG. 13 is a block diagram illustrating an SSD system 1000 including a storage device according to some example embodiments of the inventive concepts.

Referring to FIG. 13, the SSD system 1000 may include a host 1100 and an SSD 1200.

The SSD 1200 may transmit and receive a signal to and from the host 1100 through a signal connector 1211 and may receive power through a power connector 1221. The SSD 1200 may include at least one of the storage device 100 of FIG. 1 or the storage device 200 of FIG. 12. The SSD 1200 may include a plurality of flash memory components 1201 to 120m ("m" being any positive integer), an SSD controller 1210, and an auxiliary power supply 1220.

The plurality of flash memory components 1201 to 120m may be used as storage media of the SSD 1200. Non-volatile memory such as PRAM, MRAM, resistive RAM (RERAM), or FRAM as well as flash memory may be used as the SSD 1200. The plurality of flash memory components 1201 to 120m may be connected to the SSD controller 1210 through a plurality of channels Ch1 to Chm, respectively. One or more flash memory components may be connected to one channel. Flash memory connected to one channel may be connected to the same data bus.

The SSD controller 1210 may transmit and receive a signal SGL to and from the host 1100 through the signal connector 1211. Here, the signal SGL may include a command, an address, or data. The SSD controller 1210 may write or read data in or from corresponding flash memory in accordance with the command of the host 1100.

The auxiliary power supply 1220 may be connected to the host 1100 through the power connector 1221. The auxiliary power supply 1220 may receive power PWR from the host 1100 and may perform charge. On the other hand, the auxiliary power supply 1220 may be positioned in or outside the SSD 1200. For example, the auxiliary power supply 1220 may be provided on a main board and may provide auxiliary power to the SSD 1200. The auxiliary power supply 1220 may include at least one of the auxiliary power supply 120 of FIGS. 1 and 3 or the auxiliary power supply 215 of FIG. 11.

The SSD 1200 according to the inventive concepts may operate in the filtering mode when the SPO occurs and may operate in the dump mode when at least one of the first condition or the second condition is satisfied. The first condition may be satisfied when the SPO time is longer than the maximum filtering time and the second condition may be satisfied when the voltage level of the internal power provided by the auxiliary power supply 1220 is lower than the voltage level of the threshold voltage. Therefore, the SSD 1200 according to the inventive concepts may prevent unnecessary electrical energy consumption and thus reliability of the SSD 1200 may increase.

As described herein, any devices, systems, parts, blocks, modules, units, controllers, processors, circuits, apparatus, and/or portions thereof according to any of the example embodiments (including, without limitation, any of the example embodiments of the storage device 100, the PLP IC 110, the auxiliary power supply 120, the main system 130, the PLP controller 111, the first switching element 112, the second switching element 113, the DC/DC converter 114, the power management integrated circuit (PMIC) 131, the controller 132, the first memory 133, the second memory 134, the ADC 135, the PLP controller 211, the first switching element 212, the second switching element 213, the DC/DC converter 214, the auxiliary power supply 215, the SSD system 1000, the host 1100, the SSD 1200, the plurality of flash memory components 1201 to 120m, the SSD controller 1210, the auxiliary power supply 1220, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, parts, blocks, modules, units, processors, controllers, circuits, apparatuses, and/or portions thereof according to any of some example embodiments, and/or any portions thereof, including for example some or all operations of any of the methods and/or operations, shown in FIGS. 5, 6, 7, 8, 9, 10, 12, or any combination thereof.

Any of the devices including any memories as described herein (including, without limitation, any of the example embodiments of the storage device 100, the main system 130, the first memory 133, the second memory 134, the SSD system 1000, the host 1100, the SSD 1200, the plurality of flash memory components 1201 to 120m, any portion thereof, or the like) may include a non-transitory computer readable medium and may store a program of instructions and/or other information and/or may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

While the inventive concepts have been particularly shown and described with reference to some example embodiments thereof, it will be understood that various changes in form and details may be made therein without departing from the spirit and scope of the following claims.

What is claimed is:

1. A storage device, comprising:
a main system;
a power loss protection integrated circuit (PLP IC) configured to provide output power to the main system based on external power or internal power; and
an auxiliary power supply configured to provide the internal power to the PLP IC,
wherein the main system is configured to operate based on the output power and to operate in a dump mode in which data is backed up in response a determination that at least one of a first condition or a second condition is satisfied,
wherein the PLP IC is configured to provide the output power to the main system based on the internal power in response to a sudden power off (SPO) occurring,
wherein the first condition is determined to be satisfied in response to a determination that
the SPO occurs so that the output power is provided to the main system based on the internal power, and
an SPO time is longer than a maximum filtering time,
wherein the second condition is determined to be satisfied in response to a determination that
the SPO occurs so that the output power is provided to the main system based on the internal power, and
a voltage level of the internal power provided by the auxiliary power supply is lower than a voltage level of a threshold voltage, and
wherein the main system is configured to monitor the voltage level of the internal power based on monitoring a change in capacitance of the auxiliary power supply.

2. The storage device of claim 1, wherein the maximum filtering time is calculated based on dividing electrical energy, obtained by subtracting electrical energy consumed when the main system operates in the dump mode from electrical energy stored in the auxiliary power supply, by a maximum value of power consumed when the main system operates.

3. The storage device of claim 1, wherein the voltage level of the threshold voltage is
proportional to electrical energy obtained by subtracting electrical energy consumed when the main system operates in the dump mode from electrical energy stored in the auxiliary power supply, and
inversely proportional to equivalent capacitance of the auxiliary power supply.

4. The storage device of claim 1, wherein
the PLP IC comprises a PLP controller configured to
generate an external power signal based on monitoring a voltage level of the external power, and
transmit the external power signal to the main system, and
the main system comprises a controller configured to generate a power mode signal controlling the PLP controller to provide the output power based on the internal power in response to a determination that the SPO occurs in response to the external power signal.

5. The storage device of claim 4, wherein the PLP IC further comprises:
a first switching element connected to the external power and configured to be turned off in response to the SPO occurring; and
a second switching element connected to the internal power and configured to be turned on in response to the SPO occurring.

6. The storage device of claim 5, wherein the PLP IC further comprises a direct current (DC)/DC converter connected between the second switching element and the auxiliary power supply and configured to convert the internal power to have a constant voltage level.

7. The storage device of claim 1, wherein the auxiliary power supply comprises a plurality of capacitors connected to one another in parallel.

8. The storage device of claim 1, wherein the auxiliary power supply is included in the PLP IC.

9. The storage device of claim 1, wherein the auxiliary power supply is charged based on the external power in response to the SPO not occurring.

10. The storage device of claim 1, wherein the main system further comprises an analog-to-digital converter (ADC) configured to monitor the voltage level of the internal power and a voltage level of the output power.

11. The storage device of claim 1, wherein
the main system comprises:
a first memory including dynamic random access memory (DRAM), and
a second memory including NAND flash memory, and
wherein the main system is configured to back up data stored in the first memory to the second memory in response to the main system operating in the dump mode.

12. A method of operating a storage device including an auxiliary power supply, the method comprising:
determining whether a sudden power off (SPO) occurs based on monitoring a voltage level of external power;
operating in an internal power supply mode in which internal power is supplied based on electrical energy stored in the auxiliary power supply in response to a determination that the SPO occurs; and
operating in a dump mode in which data is backed up based on a determination that at least one of a first condition or a second condition is satisfied,
wherein the first condition is determined to be satisfied in response to a determination that an SPO time is longer than a maximum filtering time,
wherein the second condition is determined to be satisfied in response to a determination that a voltage level of the internal power is lower than a voltage level of a threshold voltage, and wherein the determining that the voltage level of the internal power is lower than the voltage level of the threshold voltage is determined based on monitoring a change in capacitance of the auxiliary power supply.

13. The method of claim 12, wherein the operating in the internal power supply mode comprises continuously performing an operation that is being performed after the SPO occurs based on the internal power.

14. The method of claim 12, wherein the operating in the internal power supply mode comprises converting the internal power to have a constant voltage level.

15. The method of claim 12, further comprising calculating the maximum filtering time,
wherein the maximum filtering time is calculated based on dividing electrical energy, obtained by subtracting electrical energy consumed by the storage device to operate in the dump mode from electrical energy stored in the storage device, by a maximum value of power consumed when the storage device operates.

16. The method of claim 12, further comprising calculating the voltage level of the threshold voltage,
wherein the voltage level of the threshold voltage is
proportional to electrical energy obtained by subtracting electrical energy consumed by the storage device to operate in the dump mode from electrical energy stored in the storage device, and
inversely proportional to equivalent capacitance of the auxiliary power supply.

17. The method of claim 12, wherein the operating in the internal power supply mode comprises:
turning off a first switching element connected to the external power; and
turning on a second switching element connected to the auxiliary power supply.

18. A method of operating a storage device including a main system and an auxiliary power supply, the method comprising:
generating an external power signal based on monitoring a voltage level of external power based on using a power loss protection integrated circuit (PLP IC);
generating a power mode signal controlling the PLP IC to supply internal power based on electrical energy stored in the auxiliary power supply to the main system in response to the external power signal in response to a determination by the main system that a sudden power off (SPO) occurs;
continuously performing an operation that is being performed by the main system immediately after the SPO occurs based on the internal power; and
causing the main system to back up data
from a time at which an SPO time is equal to a maximum filtering time in response to a determination that the SPO time is longer than the maximum filtering time, or
from a previous time at which a voltage level of the internal power is a same voltage level as a voltage level of a threshold voltage, in response to a determination that the voltage level of the internal power is lower than the voltage level of the threshold voltage at a current time,
wherein the determining that the voltage level of the internal power is lower than the voltage level of the threshold voltage is determined based on monitoring a change in capacitance of the auxiliary power supply.

19. The method of claim 18, further comprising calculating the maximum filtering time,
wherein the maximum filtering time is calculated based on dividing electrical energy, obtained by subtracting electrical energy consumed by the main system to back up data from electrical energy stored in the auxiliary power supply, by a maximum value of power consumed when the main system operates.

* * * * *